United States Patent [19]
Matsumoto et al.

[11] Patent Number: 5,480,818
[45] Date of Patent: Jan. 2, 1996

[54] METHOD FOR FORMING A FILM AND METHOD FOR MANUFACTURING A THIN FILM TRANSISTOR

[75] Inventors: Tomotaka Matsumoto; Jun Inoue; Teruhiko Ichimura; Yuji Murata; Junichi Watanabe; Yoshio Nagahiro; Mari Hodate; Kenichi Oki; Masahiro Okabe, all of Kawasaki, Japan

[73] Assignee: Fujitsu Limited, Kawasaki, Japan

[21] Appl. No.: 15,512

[22] Filed: Feb. 9, 1993

[30]       Foreign Application Priority Data

Feb. 10, 1992   [JP]   Japan ................................ 4-023986

[51] Int. Cl.⁶ .................................................. H01L 21/86
[52] U.S. Cl. .......................... 437/40; 437/233; 437/236; 437/913; 437/132; 148/DIG. 150; 148/DIG. 169
[58] Field of Search ............................ 437/40, 913, 132, 437/966, 101, 233, 236; 148/DIG. 150, DIG. 169, DIG. 65

[56]                References Cited

U.S. PATENT DOCUMENTS

| | | | |
|---|---|---|---|
| 4,413,022 | 11/1983 | Suntola et al. | 427/255.2 |
| 4,418,118 | 11/1983 | Lindors | 427/66 |
| 4,486,487 | 12/1984 | Skarp | 427/87 |
| 4,952,446 | 8/1990 | Lee et al. | 437/966 |
| 5,130,263 | 7/1992 | Possin et al. | 437/101 |

FOREIGN PATENT DOCUMENTS

| | | |
|---|---|---|
| 55-44789 | 3/1980 | Japan . |
| 59-29460 | 2/1984 | Japan . |
| 61-150278 | 7/1986 | Japan . |
| 61-228671 | 10/1986 | Japan . |
| 62-9623 | 1/1987 | Japan . |
| 62-179717 | 8/1987 | Japan . |
| 63-204769 | 8/1988 | Japan . |
| 63-302571 | 12/1988 | Japan . |
| 6437832 | 2/1989 | Japan . |
| 1-124263 | 5/1989 | Japan . |
| 1-158775 | 6/1989 | Japan . |
| 1-231024 | 9/1989 | Japan . |
| 0214513 | 1/1990 | Japan . |
| 2-83939 | 3/1990 | Japan . |
| 2-74029 | 3/1990 | Japan . |
| 2-246161 | 10/1990 | Japan . |
| 3-165575 | 7/1991 | Japan . |
| 3283610 | 12/1991 | Japan . |

OTHER PUBLICATIONS

Wolf et al, "Silicon Processing for the VLSI ERA". vol. 1, pp. 175–176, 1986.
"Low–Temperature Fabrication of High–Mobility Poly–Si TFT's for Large–Area LCD's", T. Serikawa et al., IEEE Transactions on Electron Devices, vol. 36, No. 9, Sep. 1989, pp. 1929–1933.

*Primary Examiner*—Tom Thomas
*Assistant Examiner*—Michael Trinh
*Attorney, Agent, or Firm*—Staas & Halsey

[57]             ABSTRACT

A crystal silicon film deposited on an insulating film made of a binary system material or a binary system semiconductor film formed by an atomic layer deposition method has a grain as large as approximately 200 nm. Thus, the mobility of carriers is increased. The crystal silicon thereof is grown within a temperature range of 250° C. to 400° C. Accordingly, when a planar type thin film transistor, an inverted stagger type thin film transistor or a stagger type thin film transistor is formed using crystal silicon formed on these films made of a binary system material, transistor characteristics thereof are improved. Further, when an impurity containing silicon film is formed by a chemical vapor deposition method between a source electrode and a drain electrode of a thin film transistor and a silicon film connected to these electrodes, and a flow rate of impurity containing gas is regulated so that impurity density becomes larger as approaching to the source electrode and the drain electrode, a leakage current in an OFF-state of the transistor is reduced. Since the impurity containing silicon film is grown by a chemical vapor deposition method in this case, the impurity density thereof can be controlled easily and the control accuracy is also improved.

24 Claims, 24 Drawing Sheets

ALD APPARATUS    P-CVD APPARATUS

PLANAR TYPE TFT

——— a first example

·········· a prior art

INVERTED STAGGER TYPE TFT

·········· a first example
———— a third example

METHOD FOR FORMING A FILM AND METHOD FOR MANUFACTURING A THIN FILM TRANSISTOR

BACKGROUND OF THE INVENTION AND RELATED ART STATEMENT

1. Field of the Invention

The present invention relates to a method for forming a film such as depositing a silicon film on a transparent substrate directly or through an insulating film and a method for manufacturing a thin film transistor used as, for example, a drive element of a liquid crystal display panel and electroluminescense.

Such a liquid crystal display panel is used in a thin type liquid crystal television, a lap top personal computer, an information terminal equipment or the like.

2. Description of the Related Art

Thin film transistor (hereinafter referred to as TFTs) are formed using a semiconductor film generally formed on a glass substrate and arranged in a matrix form. In manufacturing, they are formed by a process at such a comparatively low temperature that the glass substrate is not softened.

TFTs include a stagger type, an inverted stagger type or a planar type depending on the difference in the structure thereof.

The stagger type TFT has such a structure that a source electrode and a drain electrode are formed on the substrate side, an active semiconductor layer and an insulating film are formed thereon, and a gate electrode is formed on the insulating film.

Further, the inverted stagger type TFT has a structure that a gate electrode is formed on a substrate side, an insulating film and an active semiconductor layer are grown in consecutive order thereon, and a source electrode and a drain electrode are formed on the active semiconductor layer.

Furthermore, the planar type TFT has such a structure that an active semiconductor layer is grown on a substrate, a gate electrode is formed on the active semiconductor layer through an insulating film, and at the same time, a source layer and a drain layer are formed on both sides of the gate electrode.

The TFT is formed on an inexpensive glass substrate in many cases, and the active semiconductor layer for moving carriers is formed of amorphous silicon or polycrystalline silicon. The polycrystalline silicon is generally grown by a chemical vapor deposition method as described in Japanese Patent Provisional Publication No. 3-165575 for instance, and the amorphous silicon is formed by a similar method at a lower growth temperature.

It is preferred for the active semiconductor layer to have high carrier mobility and a small leakage current in an OFF state, i.e., an OFF-state current, but the amorphous silicon has low carrier mobility and a small leakage current, and the polycrystalline silicon has high carrier mobility and large leakage current on the contrary to the above.

In this case, it is desirable to use polycrystalline silicon having high carrier mobility so as to make the OFF-state current thereof smaller, and a method for reducing an OFF-state current has been proposed in Japanese Patent Provisional Publication No. 2-83939 for instance, as follows.

Namely, when ion implantation of impurities is made at a part making contact with source and drain electrodes in the active semiconductor layer of a stagger type TFT, conditions of injection are set so that the impurity density at the part making contact with the source electrode and the drain electrode is made the highest, and on the other hand, the impurity density is lowered as going toward the inside of the active semiconductor layer therefrom thus, a field emission current which is one of the causes of the OFF-state current is made smaller.

Further, as to a gate insulator of an inverted stagger type TFT, dielectric breakdown and low resistance defective portion caused by a pin hole, a crack or the like are liable to occur since the insulating film is laminated on the gate electrode, which is required to be prevented. As one of the preventive methods, it has been proposed to form the gate insulator by an atomic layer epitaxy method in Japanese Patent Provisional Publication No. 2-246161. Besides, according to the Publication, no description was made on crystal orientation of the gate insulator, but it is only described to form an amorphous silicon film by a plasma CVD method regarding the active semiconductor layer grown on the gate insulator and nothing was stated except the above.

In the prior art, an amorphous silicon thin film or a polycrystalline silicon thin film is accumulated on a top of a glass substrate, which is formed as an active semiconductor layer. The glass substrate itself being amorphous, however, only a very fine crystalline film having a grain size of approximately 50 nm is obtainable even if polycrystalline silicon is formed on the glass substrate directly or through $SiO_2$ or SiN.

Moreover, there is a problem that the carrier mobility cannot be made sufficiently high according to the TFT using such a silicon thin film. Here, the mobility of polycrystalline silicon formed on the glass substrate is at approximately 10 $cm^2/Vs$, and the mobility of amorphous silicon is at approximately 1 $cm^2/Vs$.

As against the above, it is conceivable to improve the crystalline property by applying heat treatment at a high temperature after film formation, but there is such a trouble that large deformation is produced on the glass substrate in case a large-sized glass substrate is used when a temperature of the softening point thereof or higher, i.e., a temperature of above 400° C., is applied for many hours.

Further, although it is also being attempted that, after an amorphous silicon thin film or a polycrystalline silicon thin film having fine crystal grains is formed on an insulating substrate, polycrystallization or monocrystallization is proceeded part by part by means of laser annealing so as to have such an operation through all the area (referenced documents: IEEE Transactions on Electron Devices, Vol. 36, No. 9, 1989, pp. 1929–1933), it takes a long time for the process, and it is also difficult to process the whole area uniformly.

Moreover, even if a silicon film having a large grain size could be formed, there is a problem of reduction in the OFF-state current remains unsolved.

In order to solve such a problem, it has been proposed to make such a profile that the impurity density at a part making contact with the source and drain electrode reaches the maximum when ion implantation of impurities into the active semiconductor layer is performed.

However, it is not easy to set conditions of ion implantation for obtaining such an impurity profile and desired impurity density, and in addition, such a complicated process to provide a film for controlling an impurity profile on the active semiconductor layer has to be performed.

OBJECT AND SUMMARY OF THE INVENTION

It is an object of the present invention to form a silicon film having a good crystallization property at a low temperature.

Further, it is another object of the present invention to form a silicon film having a good crystallization property so as to further increase the carrier mobility.

Further, it is still another object of the present invention to provide a method for manufacturing a thin film transistor in which it is possible to control the profile of impurities in an area connected to an electrode within an active semiconductor layer simply with high precision.

According to one aspect of the present invention, a film formed of a binary system material is formed by an atomic layer deposition method in which a substrate is exposed to two or more ambiences individually containing gas containing two elements alternately, and then a crystal silicon film is deposited on the film formed of a binary system material. Since a film formed by the atomic deposition method has an intense orientation property, the grain size of silicon formed on the film gets larger when a material having a lattice constant close to silicon is used as the material off the film. Moreover, since the crystal silicon film is grown at a temperature of 400° C. or lower, large deformation is not produced even if a large-sized glass substrate is used.

Further, when such a silicon film having a good crystallization property is used for an active semiconductor layer of a TFT, the carrier mobility becomes higher, thus resulting in excellent transistor characteristics.

Further, according to another aspect of the present invention, when a TFT is formed using a crystal silicon film, a silicon film doped with impurities is formed between a source electrode and a drain electrode of the TFT and a silicon film connected thereto by a chemical vapor deposition method, and the flow rate of gas containing impurities is regulated so that the impurity density thereof gets higher as getting closer to those electrodes, thus reducing the electric field strength in the vicinity of the drain so as to reduce the OFF-state current. According to the chemical vapor deposition method, the impurity density is controlled with high precision, adjustment thereof is easy, and troublesome work of forming a film for controlling the impurity profile on the silicon film may be saved.

DESCRIPTION OF THE PREFERRED EMBODIMENTS (1) The first embodiment (A first method for forming a silicon film)

Figure 1:
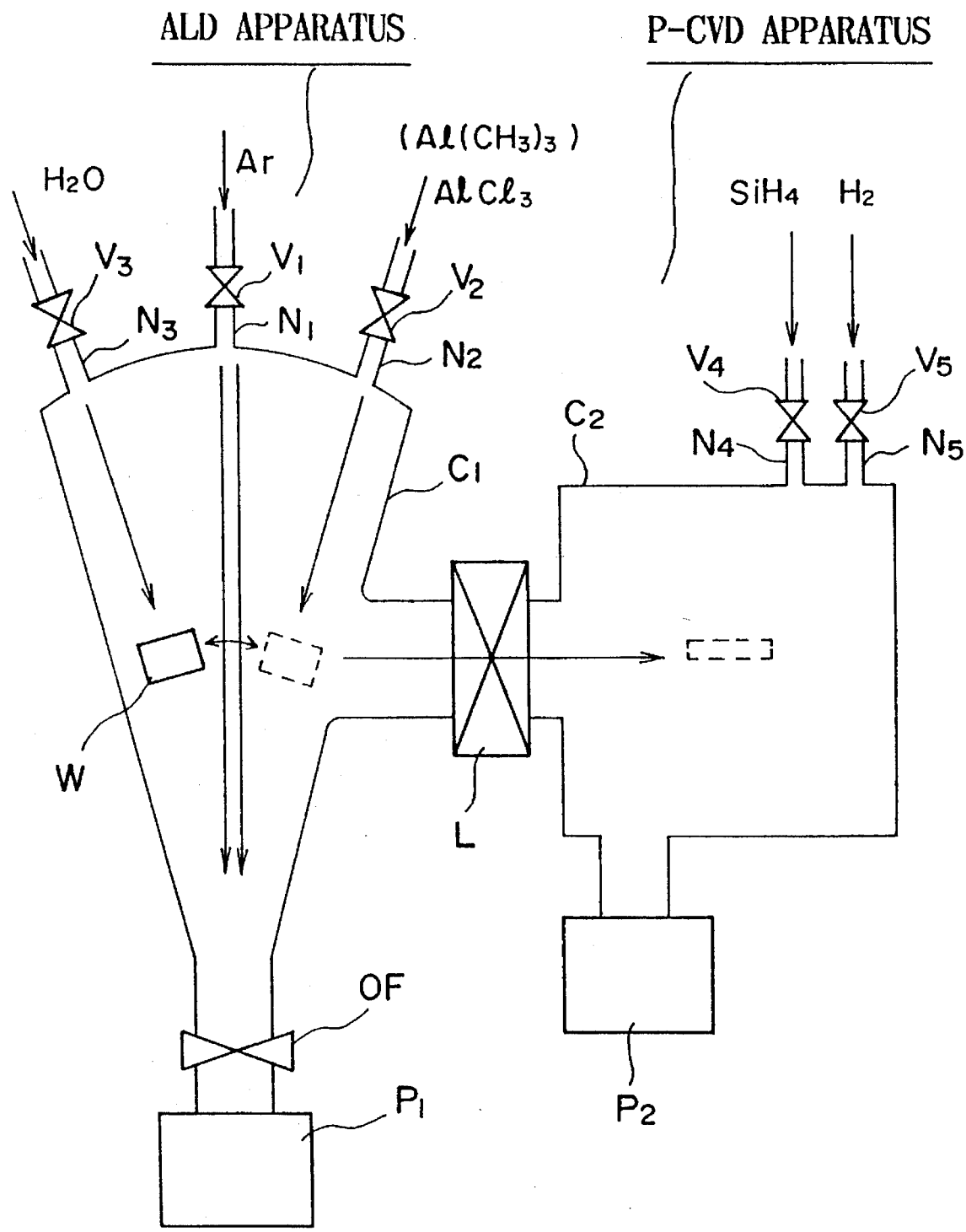
FIG. 1 is a conceptual view of a first apparatus for forming a silicon thin film.

FIG. 1 is a conceptual view showing an example of an apparatus for forming a silicon thin film according to the present invention. The present apparatus is provided with an atomic layer deposition (ALD) apparatus and a plasma chemical vapor deposition (P-CVD) apparatus, and further with a mechanism capable of conveying a base substance to reaction chambers of both apparatus without breaking vacuum.

In FIG. 1, a symbol W represents a base substance, $C_1$ and $C_2$ represent reaction chambers, L represents a load lock, $N_1$ to $N_5$ represent gas inlet ports, $V_1$ to $V_5$ represent valves connected to respective gas inlet ports $N_1$ to $N_5$ and capable of regulating flow rates, OF represents an orifice valve capable of regulating an exhaust quantity, and $P_1$ and $P_2$ represent evacuation mechanisms. Further, although it is not illustrated in particular, both reaction chambers $C_1$ and $C_2$ are provided with a mechanism for heating the base substance W and a mechanism for conveying the base substance W, respectively.

It is possible to use an apparatus for forming a thin film disclosed in Japanese Patent Provisional Publication No. 2-74029 for instance as an atomic layer deposition apparatus. In the present apparatus, as shown in FIG. 1, the gas inlet port $N_1$ is arranged at a central part of the reaction chamber $C_1$ having an almost fan shape in the plane form so that argon barrier gas which is inert gas flows, the gas inlet ports $N_2$ and $N_3$ are arranged at right and left positions with the gas inlet port $N_1$ as the center, the orifice valve OF is further provided at the position of the pivot of the fan shape, and a turbo-molecular pump for instance is arranged on the exhaust side as the evacuation system mechanism $P_1$.

As the plasma CVD apparatus, it is possible to use an ordinary one provided with gas inlet ports $N_4$ and $N_5$ and the evacuation system mechanism $P_2$, and though it is not illustrated in particular, with electrodes putting the base substance therebetween and a high frequency power source for applying voltage to those electrodes, a substrate heating mechanism and so on.

Next, a method for forming a silicon thin film on a glass substrate which becomes the base substance W using the above-described apparatus will be sshown as a first embodiment.

Figure 2:
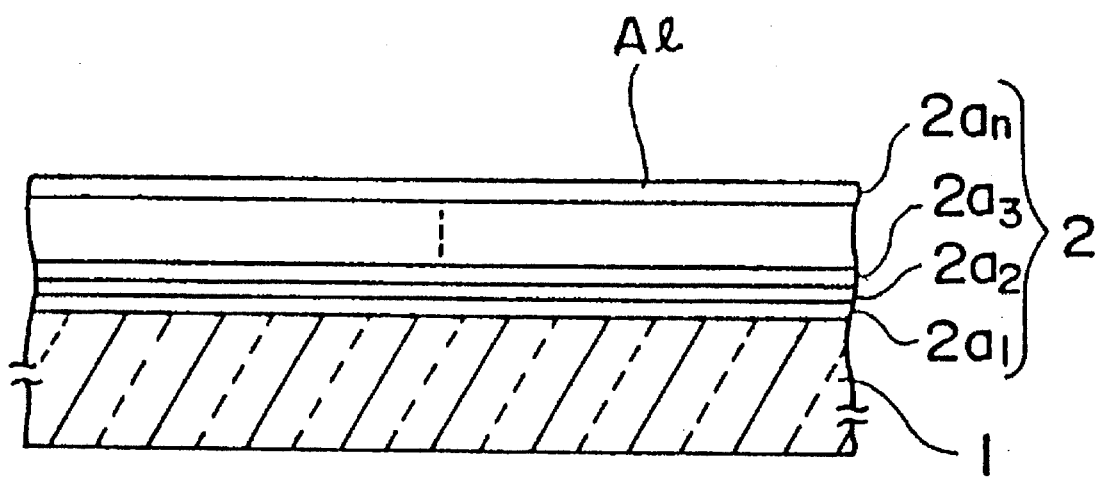
FIG. 2(a) and FIG. 2(b) are sectional views showing a first example of a process of forming a silicon thin film.
Figure 2:
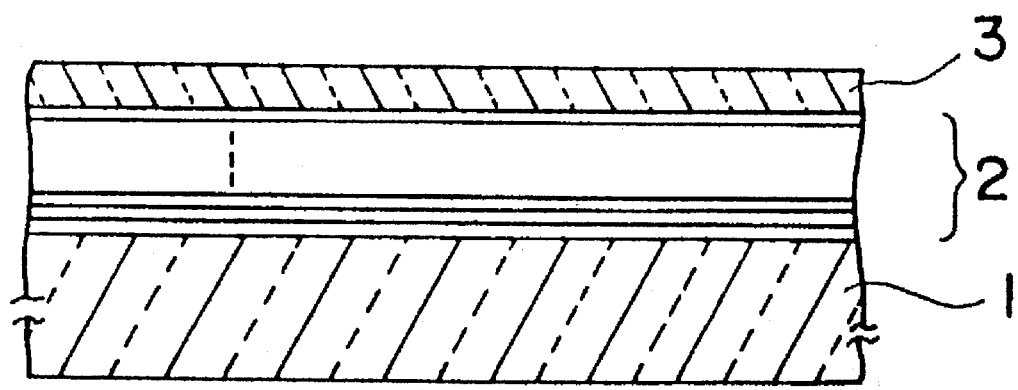

FIG. 2(a) and (b) are sectional views showing a process of forming a silicon thin film, in which a reference numeral 1 represents a glass substrate, 2 represents an $Al_2O_3$ film which is a film formed of a binary system material, $2a_1$ to $2a_n$ represent a monoatomic layers in which an oxygen atomic layer and an aluminum atomic layer are arranged alternately, and 3 represents a crystal silicon film,. Here, a boro-silicated glass substrate is used as the glass substrate 1, for instance.

First, the glass substrate 1 is arranged in the reaction chamber $C_1$ of the atomic layer deposition apparatus. In this case, the glass substrate 1 is attached to a mechanism (not illustrated) reciprocating left and right across a gas layer at the center where argon barrier gas is flowing. The film forming surface of the glass substrate 1 is arranged so as to face to the gas inlet ports $N_1$ to $N_3$.

Then, the glass substrate 1 is heated to 300° C., and the inside of the reaction chamber $C_1$ is exhausted down to $5 \times 10^{-7}$ Torr by means of the evacuation system mechanism $P_1$ having a turbo-molecular pump. Next, the orifice valve OF is throttled so that the inside of the reaction chamber $C_1$ shows 0.01 Torr (1.33 Pa) while flowing argon gas at 500 sccm by opening a first valve $V_1$, thus forming a stationary flow of argon gas.

Then, the second valve $V_2$ is opened so as to introduce aluminum trichloride ($AlCl_3$) vapor heated to 110° C. into the reaction chamber $C_1$a through the gas inlet port $N_2$. Further, the third valve $V_3$ is opened so as to introduce water vapor ($H_2O$) in a water container maintained at 20° C. using hydrogen for the carrier gas into the reaction chamber $C_1$ through the gas inlet port $N_3$.

In this case, the aluminum trichloride vapor and the water vapor are separated from each other by the stationary flow of argon gas, and are not mixed with each other. The orifice valve OF is regulated so that the degree of vacuum in the reaction chamber $C_1$ at that time is maintained at 0.01 Torr.

Further, the glass substrate 1 mounted on a conveyance mechanism not illustrated is moved reciprocatingly through an aluminum trichloride vapor ambience and a water vapor ambience alternately at a speed which does not disturb the stationary flow, e.g., in a reciprocating period of 3 seconds. Such reciprocating movement is repeated 6,000 times and an aluminum (Al) layer and an oxygen (O) layer are deposited alternately, thereby to grow an $Al_2O_3$ film 2 having a thickness of 400 nm composed of a plurality of monoatomic layers $2a_1$ to $2a_n$ on the glass substrate 1. Such a method for growing a film is called an ALD method.

The last step of growth is to be through an aluminum trichloride vapor ambience so as to form the uppermost layer $2a_n$ of the $Al_2O_3$ layer 2 into an aluminum layer as shown in FIG. 2(a).

Then, the load lock L is opened and the glass substrate 1 is conveyed to the reaction chamber $C_2$ of the plasma CVD apparatus therethrough. The load lock L is closed again thereafter. Thus, a crystal silicon film 3 having a thickness of 100 nm is grown on the $Al_2O_3$ film 2 by the plasma CVD method.

Here, the reason why an expression of crystal silicon is adopted is that the silicon has a larger grain size than that of prior art polycrystalline silicon and may also be referred to as monocrystalline silicon.

The growth conditions are such that the substrate temperature is set to 400° C., the flow rate of silane ($SiH_4$) is set to 10 sccm, the flow rate of hydrogen ($H_2$) is set 500 sccm, the pressure in the chamber is set to 0.5 Torr (66.5 Pa), the discharge power of the radio frequency power source is set to 200 W, and the discharge hour is set to 30 minutes.

With this, the crystal silicon film 3 having a large grain size having a diameter of a crystal grain as large as approximately 200 nm is formed in the film thickness of 100 nm as shown in FIG. 2(b). The mobility thereof becomes 30 $cm^2/Vs$.

Figure 3:
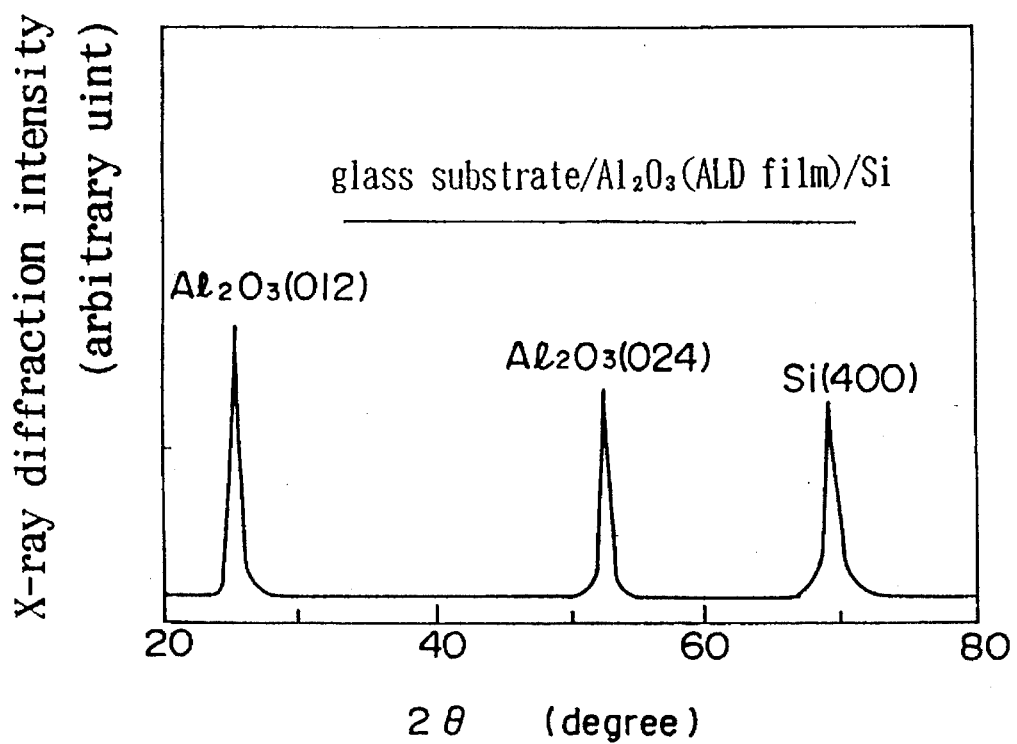
FIG. 3(a) and FIG. 3(b) are characteristic diagrams by an X-ray diffraction method of a silicon thin film after the forming process in the first example.
Figure 3:
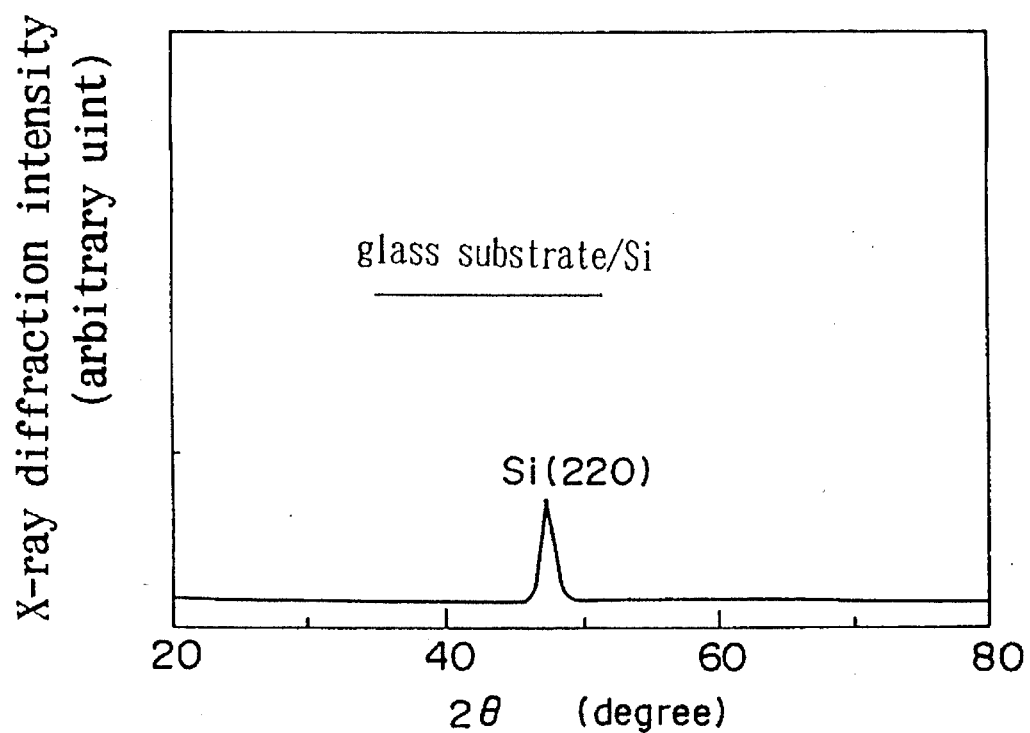

When the crystal orientation of the growth surface of the $Al_2O_3$ film 2 and the crystal silicon film 3 was investigated by an X-ray diffraction method, preferential orientation of a plane (012) was noticed in the $Al_2O_3$ film 2 and preferential orientation of a plane (100) was noticed in the crystal silicon film 3 as shown in FIG. 3(a).

As compared with the above, a silicon film which grew on the glass substrate 1 directly or through a SiN film in accordance with a prior art showed crystal orientation of a plane (110) and small X-ray diffraction intensity as shown in FIG. 3(b).

In FIG. 3(a), a plane orientation (024) of a peak of $Al_2O_3$ is equivalent to (012), (400) of the peak of Si is equivalent to (100), and the plane orientation (220) of the peak of S1 shown in FIG. 3(b) is equivalent to (110).

Besldes, the growth of the crystal silicon film 3 shows similar results when it is formed by a low pressure CVD method and a sputtering method other than the plasma CVD method. The growth temperature thereof is to be within a range of 250° C. to 400° C.

There are a GaP film, an AlP film, an AlN film, a ZnS film or the like other than an $Al_2O_3$ film as a film formed of a binary system material formed by the atomic layer deposition method. For example, two types of gas such as $Ga(CH_3)_3$ and $PH_3$ in the case of the GaP film, $Al(CH_3)_3$ and $PH_3$ in the case of the AlP film, $Al(CH_3)_3$ and $NH_3$ in the case of the AlN film, and $Zn(CH_3)_2$ and $H_2S$ in the case of the ZnS film are supplied separately by partitioning the gas with an argon gas layer. Here, the growth temperature of a film made of a binary system material is to be within a range of 200° C. to 400° C.

Figure 9:
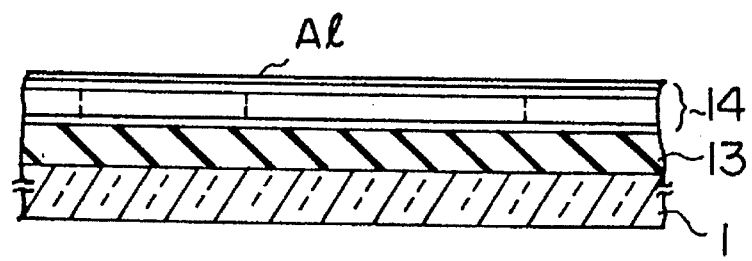
FIG. 9(a) to FIG. 9(g) are sectional views showing a process of manufacturing a second example of a planar type silicon thin film transistor.
Figure 9:
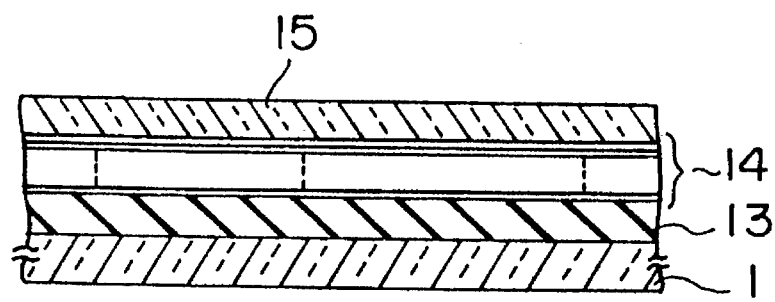
Figure 9:
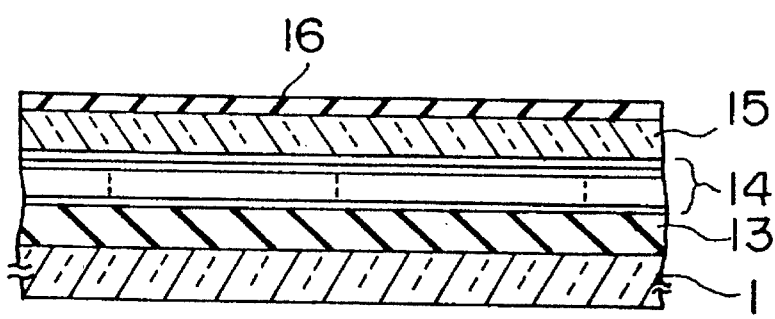
Figure 9:
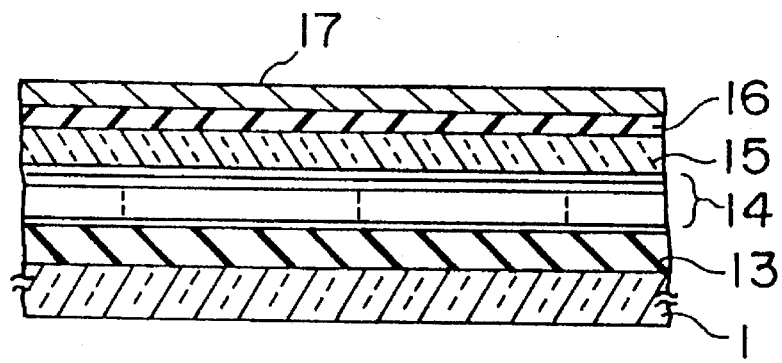
Figure 9:
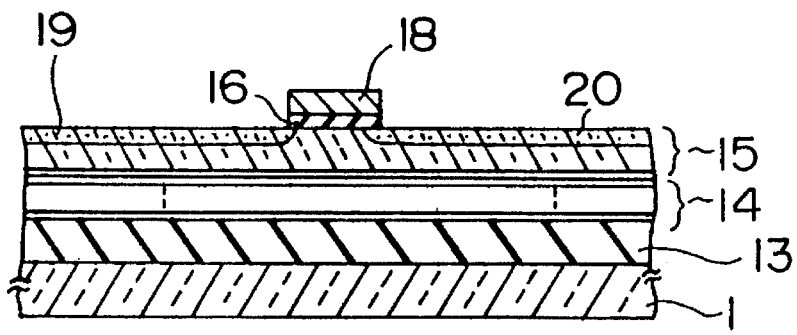
Figure 9:
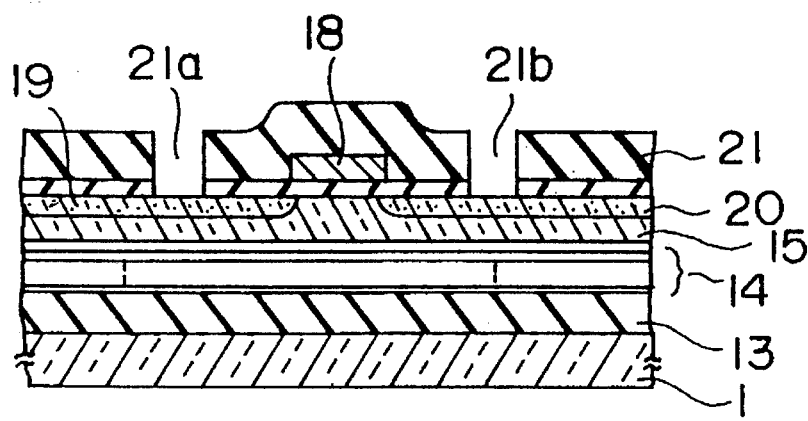
Figure 9:
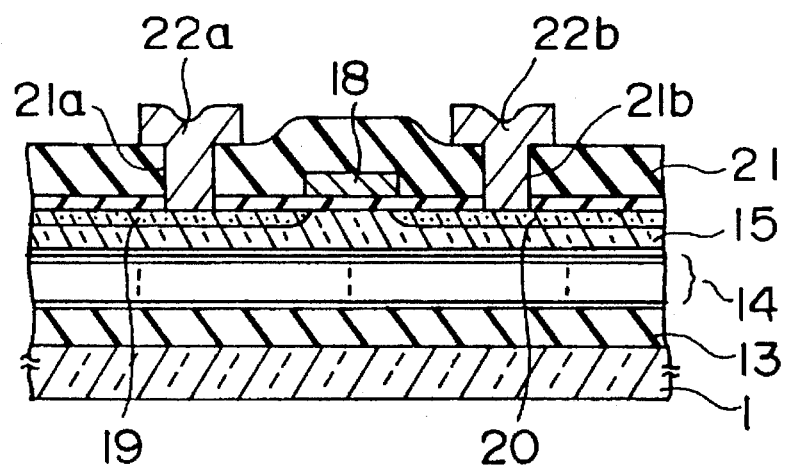

Furthermore, the film formed of a binary system material may be formed through a layer of SiN, SiON, $SiO_2$ or the like as a foundation layer thereof as shown in FIGS. 9(a) and (b) mentioned later, other than to form the film directly on the glass substrate 1. With this, an initial growth state having a great influence on the film quality is improved and preferential orientation of a plane (012) of the $Al_2O_3$ film 2 is produced more easily, thus further improving the film quality of the crystal silicon film 3.

Above-described method for growing crystal silicon, selection of a film formed of a binary system material, and selection on whether an insulating film is to be formed under the film formed of a binary system material are applied in a similar manner even if they are not described in particular in the embodiments described hereinafter.

(2) The second embodiment (A second method for forming a silicon film)

In the first embodiment, an Al layer is formed as the uppermost layer $2a_n$ of the $Al_2O_3$ film 2, but since Al is liable to react on $H_2O$ and it becomes difficult for silicon to grow epitaxially thereon when reaction occurs, it is required to produce a clean Al surface. It is sufficient to apply preprocessing at approximately 1,300° C. for such a purpose, which, however, is not suitable because deformation occurs surely on the glass substrate 1 under the temperature condition mentioned above.

Now, a method for growing silicon while maintaining the Al surface clean without applying heat processing at such a high temperature will be described as a second embodiment.

Figure 4:
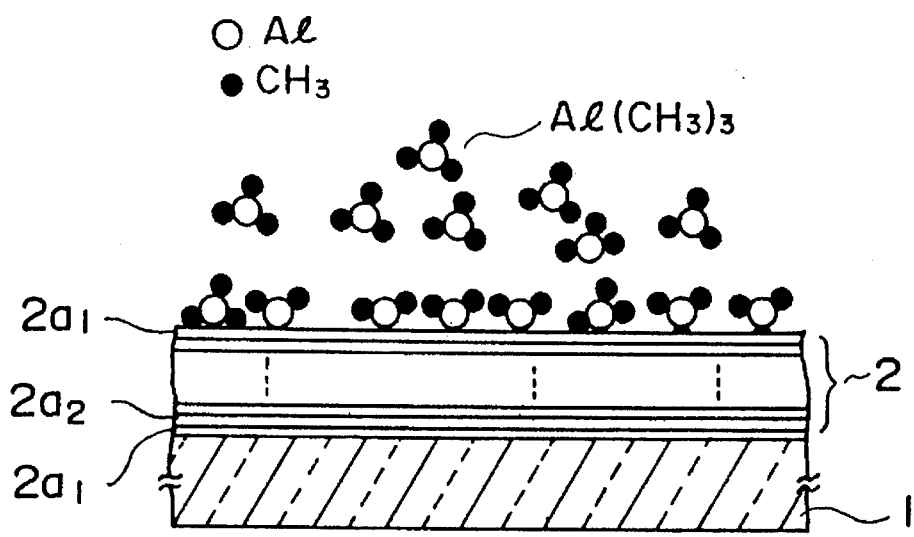
FIG. 4(a) to FIG. 4(c) are explanatory views showing a second example of a process of forming a silicon thin film with sections.
Figure 4:
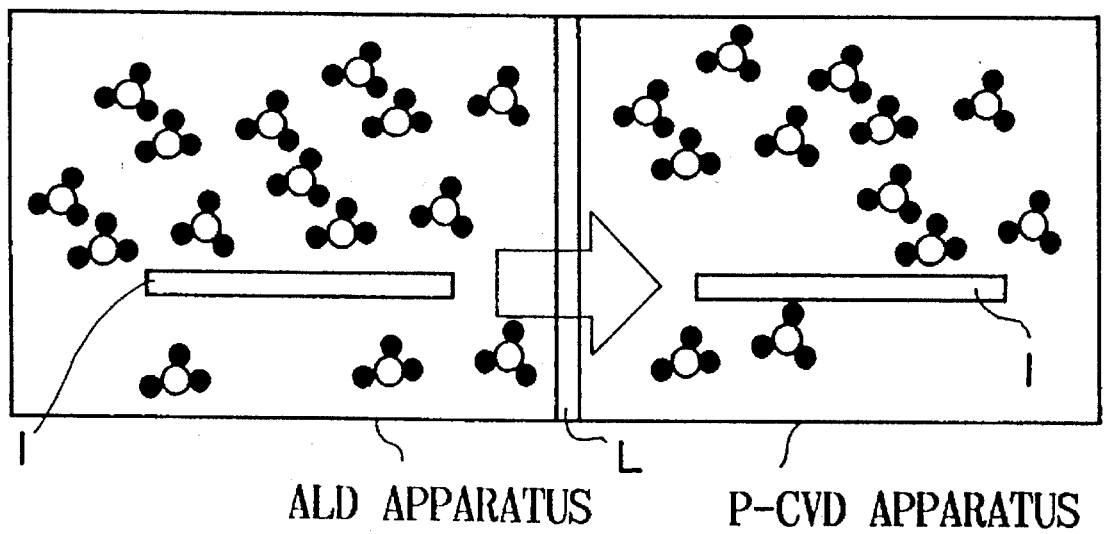
Figure 4:
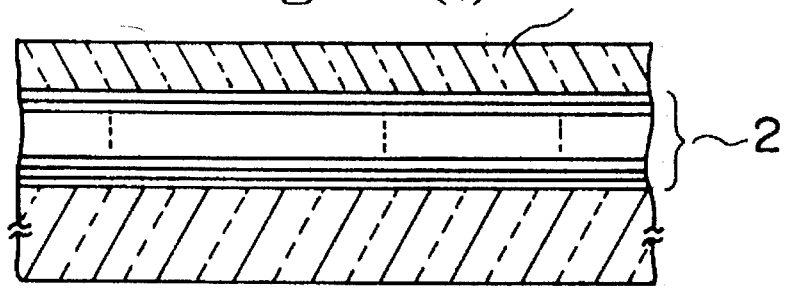

FIG. 4 shows conceptual views showing a silicon n film process showing the second embodiment of the present invention. In this embodiment, an apparatus having the structure shown in FIG. 1 is also used.

First, the glass substrate i is arranged in the reaction chamber $C_1$ of the atomic layer deposition apparatus in the similar manner as the first embodiment. Further, the glass substrate 1 is heated to 400° C., and the reaction chamber $C_1$ is exhausted by means of the evacuation system mechanism $P_1$ until $5 \times 10^{-7}$ Torr ($6.7 \times 10^{-5}$ Pa) is reached. Then, the first valve $V_1$ is opened so as to flow argon (Ar) gas at a flow rate of 500 sccm, and the orifice valve OF is regulated so as to reach 0.01 Torr, thus producing a stationary flow off argon gas.

Thereafter, the second valve $V_2$ is opened so as to introduce $Al(CH_3)_3$ vapor into the reaction chamber $C_1$ through the gas inlet port $N_2$. Furthermore, the third valve $V_3$ is opened so as to introduce water vapor ($H_2O$) into the reaction chamber $C_1$ through the gas inlet port $N_3$ from a water container maintained at 20° C. Further, the degree of vacuum in the reaction chamber $C_1$ is maintained at 0.01 Torr. In this case, the $Al(CH_3)_3$ vapor and the $H_2O$ vapor are separated from each other by means of the stationary flow of argon gas, and are not mixed with each other.

Furthermore, the glass substrate 1 on a conveyance mechanism not illustrated is moved reciprocatingly through the $Al(CH_3)_3$ ambience and the $H_2O$ ambience so that the supplying hours of $Al(CH_3)_3$ and $H_2O$ are set to one second, respectively, and the purge hour by argon gas becomes 5 seconds. Then, by repeating the reciprocating movement 300 times, a polycrystalline or monocrystalline $Al_2O_3$ film 2 having a film thickness of 50 nm is grown on the glass substrate 1 as shown in FIG. 4(a). In this case, the growth is to be ended through the $Al(CH_3)_3$ ambience so as to form the uppermost layer $2a_n$ of the $Al_2O_3$ film 2 in an Al layer.

Thereafter, the third valve $V_3$ of the atomic layer deposition apparatus is closed, remaining valves $V_1$ and $V_2$ are closed in succession and the load lock L is opened so as to convey the glass substrate 1 to the reaction chamber $C_2$ of the plasma CVD apparatus, and then the load lock L is closed again. In this case, a state in which $Al(CH_3)_3$ is introduced into the reaction chamber $C_2$ through a gas inlet port not illustrated is produced, and also the glass substrate 1 is set to a temperature lower than the growth temperature of an $Al_2O_3$ film 12, e.g., a temperature of 350° C., so that tile adsorbed Al atom is not dissociated.

FIG. 4(b) is a schematic diagram showing the glass substrate 1 and the ambience therearound before and after the substrate 1 is moved to the plasma CVD apparatus, and the Al layer of the uppermost layer $2a_n$ of the $Al_2O_3$ film 2 is moved to the plasma CVD apparatus as it is kept exposed to the $Al(CH_3)_3$ gas ambience, thereby to prevent reaction with $H_2O$.

Next, after introduction of $Al(CH_3)_3$ gas into the reaction chamber $C_2$ of the plasma CVD apparatus is stopped, the fourth valve $V_4$ and the fifth valve $V_5$ are opened so as to introduce silane ($SiH_4$) at a flow rate of 10 sccm and hydrogen ($H_2$) at a flow rate of 500 sccm and, at the same time, the substrate temperature is set to 350° C. Further, setting the pressure in the reaction chamber $C_2$ to 0.5 Torr (67 Pa), the discharge power to 200 W, and the discharge hour to 30 minutes, the crystal silicon film 3 having a thickness of 100 nm is grown on the uppermost monoatomic layers $2a_n$ of the $Al_2O_3$ film 2 as shown in FIG. 4(c).

Then, when the film quality of the crystal silicon film 3 on the $Al_2O_3$ film 2 was investigated, it was found that a crystal silicon film including a crystal grain having a diameter as large as approximately 200 nm and good crystallization property was obtainable. Further, when the crystal orientation of the growth surface of the $Al_2O_3$ film and the crystal silicon film 3 was investigated, it was found that preferential orientation of the plane (012) was produced in the $Al_2O_3$ film 12 and preferential orientation of the plane (100) was produced in the crystal silicon film 3 thereon.

Besides, the crystal silicon film 3 on the $Al_2O_3$ film 2 may be grown by a low pressure CVD method or a sputtering method in a similar manner as the first embodiment but it is required to expose the Al layer of the uppermost layer of the $Al_2O_3$ layer to the $Al(CH_3)_3$ ambience until the glass substrate 1 is placed in the silane gas ambience in this case, too.

(3) The third embodiment (A third method for forming a silicon film)

In order to further improve the film quality of the $Al_2O_3$ film formed by the above-described two embodiments, it is important to obtain a good heterointerface with the glass substrate. For such a purpose, it is required to control initial conditions for film formation extensively and also to perform film formation thereafter under stable conditions.

Now, according to the atomic layer deposition apparatus shown in FIG. 1 having one reaction chamber $C_1$, stable gas supply, temperature setting, pressure regulation or the like are easy, but the heterointerface with the glass substrate is not necessarily brought to a stabilized good state only with the operation described above.

So, an apparatus for forming a thin film in which the initial conditions for film formation can be controlled easily will be described hereinafter as a third embodiment.

Figure 5:
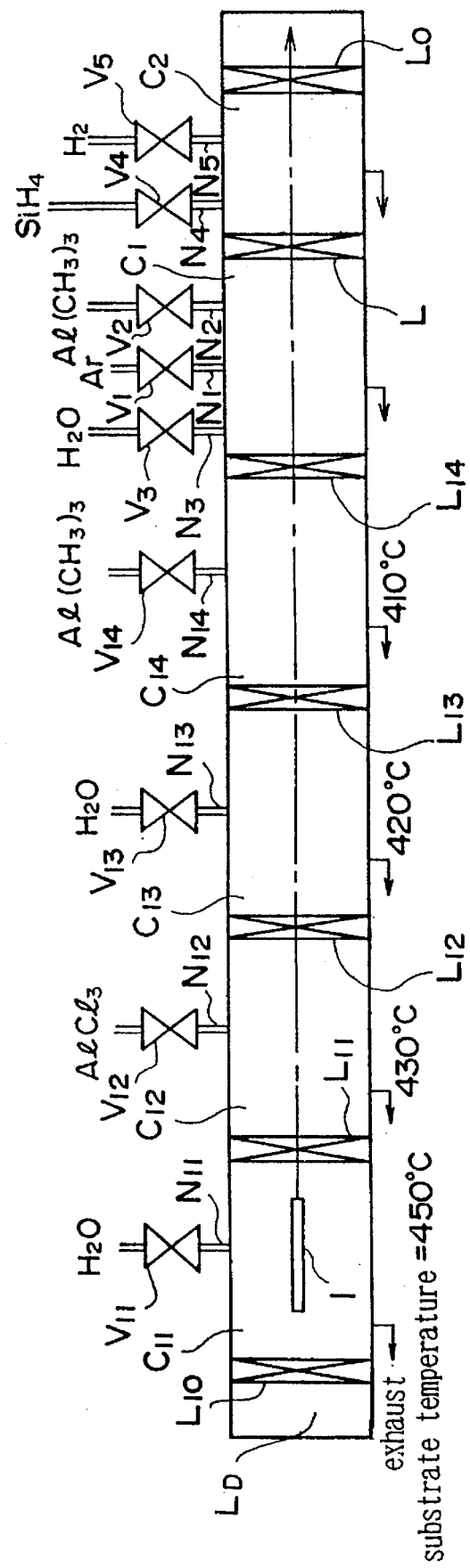
FIG. 5 is a conceptual view of a second apparatus for forming a silicon thin film.

FIG. 5 is a schematic block diagram showing the third embodiment of the present invention, in which the atomic layer deposition apparatus and the plasma CVD apparatus shown in FIG. 1 are used in a part thereof. Further, a first to a fourth reaction chambers $C_{11}$ to $C_{14}$ are connected from the outside successively through load lock $L_{11}$ to $L_{14}$, respectively, on the opposite side of the plasma CVD apparatus in the atomic layer deposition apparatus, and, in the first reaction chamber $C_{11}$ which is most distant from the atomic layer deposition apparatus among those reaction chambers, a loading chamber LD for fitting the glass substrate 1 to a substrate moving mechanism (not illustrated) is arranged through a load lock $L_{10}$.

Further, the first to the fourth reaction chambers $C_{11}$ to $C_{14}$ are provided with gas inlet ports having valves $V_{11}$ to $V_{14}$, and are structured so that $H_2O$, $AlCl_3$, $H_2O$ and $Al(CH_3)_3$ gas is supplied into respective reaction chamber $C_{11}$ to $C_{14}$, respectively, in the order of the shorter distance to the loading chamber LD. Further, there are provided an evacuation system equipment, a substrate heater or the like not illustrated in the reaction chamber $C_{11}$ to $C_{14}$.

Here, various conditions such as gas introduction into the reaction chambers $C_1$ and $C_2$ and the substrate heating temperature in the atomic layer deposition apparatus and the plasma CVD apparatus are to be the same as the conditions described in the first embodiment.

Next, a process of accumulating an $Al_2O_3$ film on the glass substrate 1 using the above-described apparatus will be described.

First, the glass substrate 1 is set in a substrate moving mechanism (not illustrated) in the loading chamber LD, and the glass substrate 1 is conveyed to the first reaction chamber $C_{11}$ through the load lock $L_{10}$ provided between the LD and the first reaction chamber $C_{11}$ after reducing the pressure in the loading chamber LD down to $1 \times 10^{-5}$ Torr ($1.33 \times 10^{-3}$ Pa).

Figure 6:
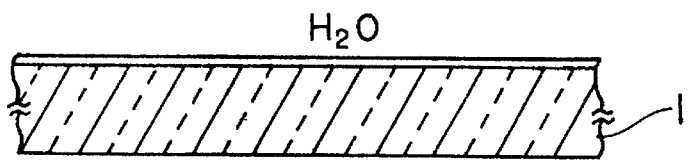
FIG. 6(a) to FIG. 6(f) are sectional views showing a third example of a process of forming a silicon thin film.
Figure 6:
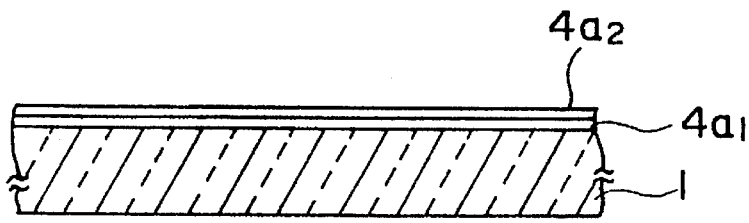
Figure 6:
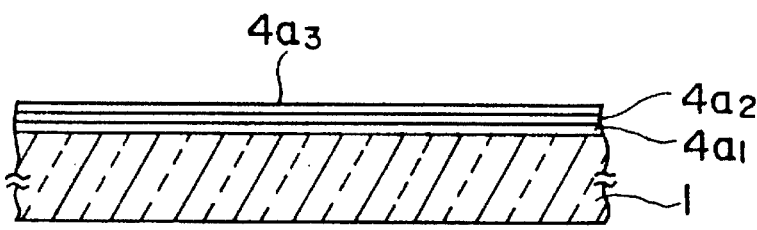
Figure 6:
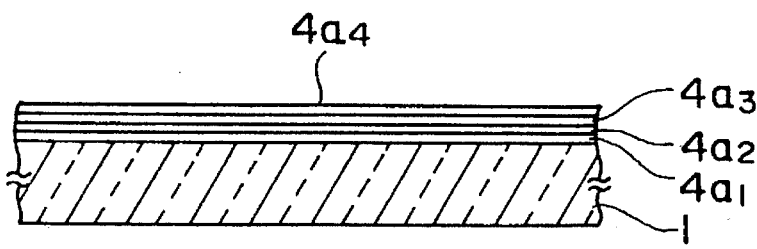
Figure 6:
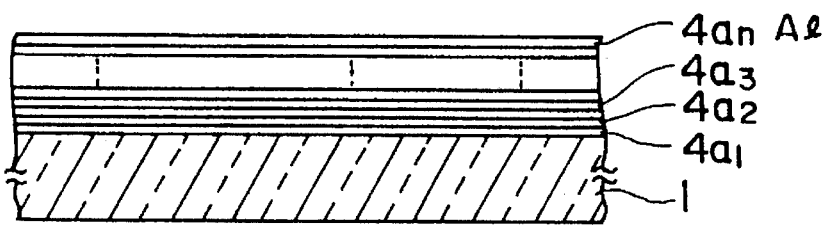
Figure 6:
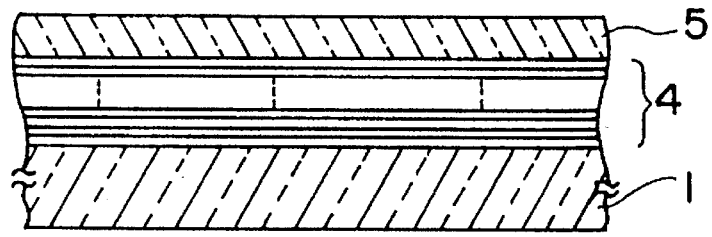

Then, the glass substrate 1 is heated to 450° C. in the first reaction chamber $C_{11}$, and the surface thereof is exposed to $H_2O$ for two seconds, thereby to have elements of hydrogen (H) and oxygen (O) adsorbed on the topside thereof as shown in FIG. 6(a).

Next, the glass substrate 1 is conveyed to the second reaction chamber $C_{12}$ through the load lock $L_{11}$ at the next stage, the topside thereof is exposed to $AlCl_3$ for 1.5 seconds in a state that the glass substrate 1 is kept at 430° C., and HCl generated on the surface thereof is made to sublime, and an Al layer $4a_2$ is formed on an oxygen (O) layer $4a_1$ on the topside of the glass substrate 1 as shown in FIG. 6(b).

Here, the reason why $AlCl_3$ is used instead of $Al(CH_3)_3$ is that it is required to promote the reaction by producing HCl having better volatility than $CH_4$ since the reaction is hard to proceed on the surface of the glass substrate 1.

Next, the glass substrate 1 is moved to the third reaction chamber $C_{13}$ through the load lock $L_{12}$ at the next stage, and the top surface is exposed to $H_2O$ for one second in a state that the glass substrate 1 is heated to 420° C., thereby to have Cl remaining on the Al layer $4a_2$ sublime as HCl, and form an O layer $4a_3$ on the Al layer $4a_2$ as shown in FIG. 6(c).

Thereafter, the glass substrate 1 is moved to the fourth reaction chamber $C_{14}$ through the next load lock $L_{13}$, the substrate temperature is set to 410° C., $Al(CH_3)_3$ is irradiated for one second to the O layer $4a_3$, and the Al layer $4a_4$ is laminated on the O layer $4a_3$ as shown in FIG. 6(d). Thereafter, the glass substrate 1 is placed in the reaction chamber $C_1$ of the atomic layer deposition apparatus through the load lock $L_{14}$ at the next stage.

In the process described above, the time required since the glass substrate 1 is placed in the first reaction chamber $C_{11}$ until it is taken out of the fourth chamber $C_{14}$ is approximately 2 minutes, and the deformation produced on a large-sized glass substrate 1 remains within an allowable range even if deformation is produced.

Furthermore, a plurality of O layers and Al layers are formed alternately in the reaction chamber $C_1$ by the ALD method similarly to the second embodiment, and an Al layer $4a_n$ is formed as the last layer as shown in FIG. 6(e). Thereafter, a crystal silicon film 5 is formed in a thickness of approximately 100 nm by means of the plasma CVD apparatus without breaking vacuum in a similar manner as the second embodiment as shown in FIG. 6(f).

As described above, when monoatomic layers of the O layers $4a_1$ and $4a_3$ and the Al layers $4a_2$ and $4a_4$ are formed alternately on the surface of the glass substrate 1 by varying the conditions and the O layer and the Al layer are formed thereafter in accordance with fixed conditions, the film quality of the $Al_2O_3$ film 4 formed on the glass substrate 1 is improved, preferential orientation of the plane (012) becomes to be produced more easily, and the plane (100) of the crystal silicon film 5 orients preferentially more easily.

Besides, such a mechanism is provided that the conditions such as the substrate temperatures in respective reaction chambers $C_{11}$ to $C_{14}$ may be changed depending on the film to be grown.

(4) The fourth embodiment (A method for manufacturing a first planar type silicon TFT)

Next, as a fourth embodiment, a process of manufacturing a first planar type TFT using a silicon thin film obtained as described above will be explained with reference to the drawings.

Figure 7:
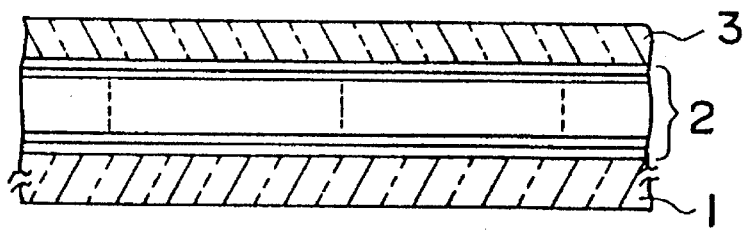
FIG. 7(a) to FIG. 7(e) are sectional views showing a process of manufacturing a first example of a planar type silicon thin film transistor.
Figure 7:
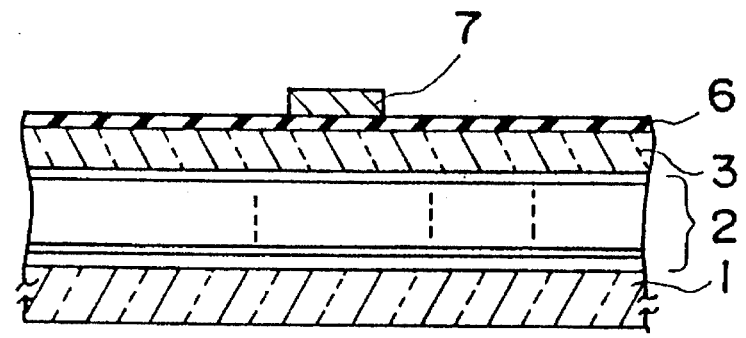
Figure 7:
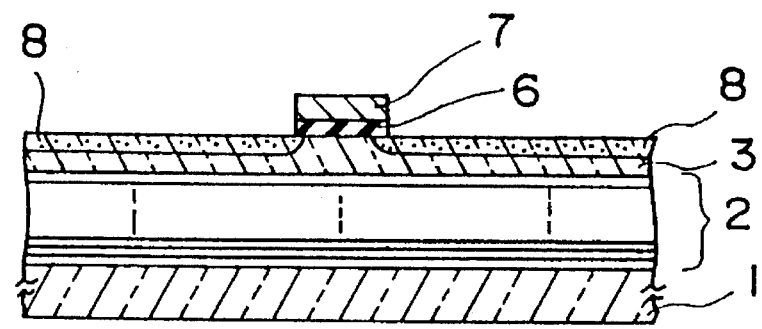
Figure 7:
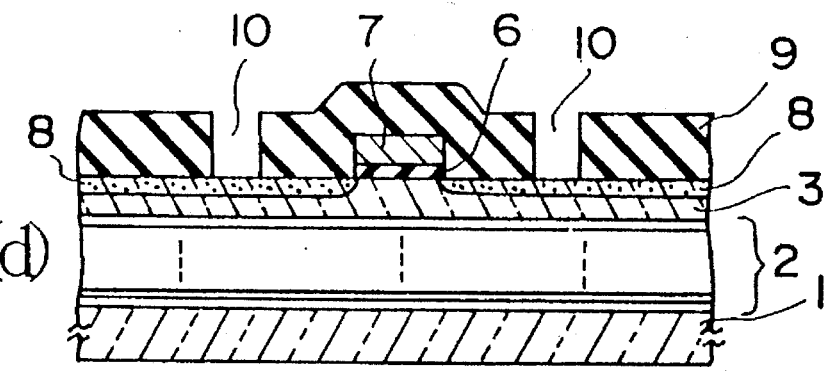
Figure 7:
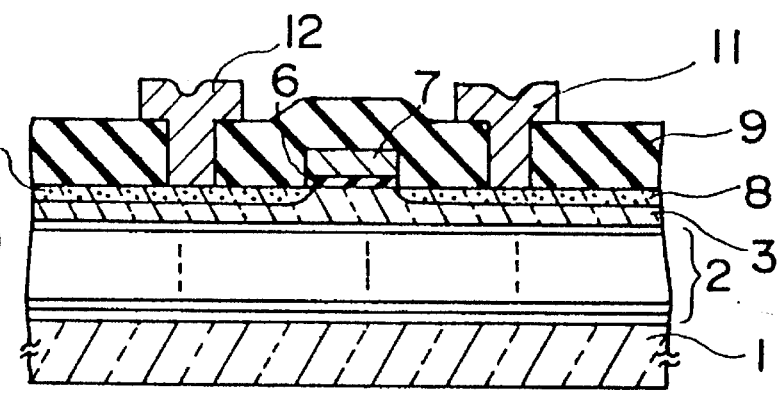

First, the sectional view shown in FIG. 7(a) 1s the same as FIG. 2(b), and the process up to this point is performed in accordance with the methods for forming a film shown in the first, the second or the third embodiment.

Next, as shown in FIG. 7(b), a $SiO_2$ film 6 having a thickness of 100 nm which becomes a gate insulator is formed by the plasma CVD method. The conditions for film formation are such that the substrate temperature is at 300° C., the flow rate of silane ($SiH_4$) is at 20 sccm, the flow rate of nitious oxide ($N_2O$) is at 2,000 sccm, the pressure is at 0.3 Torr (40 Pa), the discharge power is at 100 W, and the discharge hour is 5 minutes. This gate insulator may be formed by the sputtering method or the CVD method.

Thereafter, molybdenum (Mo) is formed in a thickness of 50 nm by means of the sputtering method, and a gate electrode 7 is formed by a photo-etching process. Furthermore, the $SiO_2$ film 6 is removed by etching with the gate electrode 7 as a mask, and then, phosphorus ions ($P^+$) are injected so as to form source and drain layers 8 on both sides of the gate electrode 7 as shown in FIG. 7(c).

Patterning is applied to the crystal silicon film 3 in this state by a photolithography method using a photoresist pattern as a mask so as to isolate elements from each other.

Furthermore, as shown in FIG. 7(d), a $SiO_2$ film 9 is grown in a thickness of 300 nm as an interlayer insulator by the CVD method, and then openings 10 for contact are formed in the $SiO_2$ film 9 on both sides of the gate electrode 7.

Lastly, as shown in FIG. 7(e), an aluminum film having a thickness of 100 nm is deposited by the sputtering method, and electrodes 11 and 12 for source and drain, respectively, are formed in two openings 10 by patterning the aluminum film.

Figure 8:
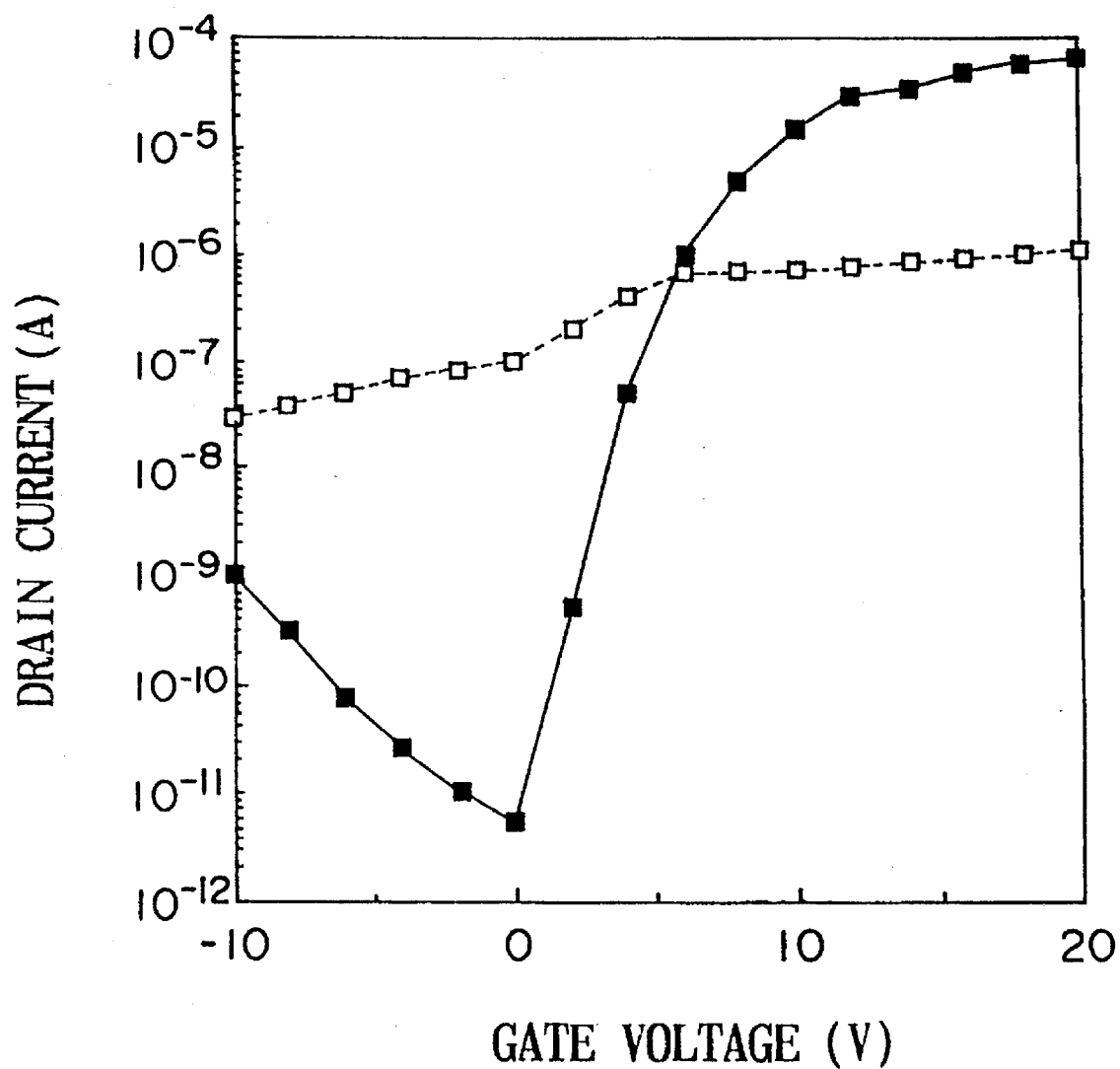
FIG. 8 is a characteristic diagram of a first example of a planar type silicon thin film transistor.

According to the planar type TFT thus completed, the grain size of the crystal silicon film which becomes an active semiconductor layer is large. Therefore, the carrier mobility in a channel area becomes higher, the transistor characteristics are improved, a relationship between a gate electrode and a drain current such as shown by a solid line in FIG. 8 is obtainable, and the drain current can be changed by a large margin of seven figures or more by the change of the gate voltage. Thus, almost ideal characteristics are obtainable, and the planar type TFT can be used as a switching element.

As against the above, in a planar type TFT of a prior art, in which a polycrystalline silicon film is formed on a glass substrate without forming a film by the ALD method and is used as an active semiconductor layer, a of characteristic such as shown with a broken line in FIG. 8 is presented and the drain current depending on the magnitude of the gate voltage changes only by about one to two figures. Thus, such a TFT is not preferable as a switching element.

(5) The fifth embodiment (A method for manufacturing a second planar type silicon TFT)

In the above-described fourth embodiment, an $Al_2O_3$ film shown in the first, the second or the third embodiment is formed, and a crystal silicon film is laminated thereon so as to form a planar type TFT, but an insulating film which becomes an intermediate layer such as a SiN, $SiO_2$ or SiON film may be put between the $Al_2O_3$ film and the glass substrate.

Next, as a fifth embodiment, a process of laminating a SiN intermediate layer and an Al$_2$O$_3$ film successively on a glass substrate and forming a second planar type TFT thereon will be described. Here, the apparatus shown in FIG. 1 is used in this embodiment.

First, the glass substrate 1 is placed in the reaction chamber C$_2$ of the plasma CVD apparatus, and a SiN film 18 is formed thereon in a thickness of 300 nm. The conditions for film formation in this case are such that the glass substrate 1 is heated to a temperature of 400° C., and SiH$_4$, NH$_3$ and N$_2$ are introduced into the reaction chamber C$_2$ at flow rates of 50 sccm, 100 sccm and 2 slm, respectively. Further, the internal pressure of the reaction chamber C$_2$ is set to 100 Pa, and the discharge power between electrodes is set to 200 to 300 W.

Then, the glass substrate 1 is moved to the reaction chamber C$_1$ of the atomic layer deposition apparatus through the load lock L, and a polycrystal or single crystal Al$_2$O$_3$ film 14 is formed on the SiN film 13. In this case, the uppermost surface is formed into an Al layer by setting the conditions for film formation similarly to those in the second embodiment.

In succession, the glass substrate 1 is returned to the reaction chamber C$_2$ of the plasma CVD apparatus through the load lock L without breaking vacuum, and a crystal silicon film 15 which becomes an active semiconductor layer of a TFT is formed on the Al$_2$O$_3$ film 14 as shown in FIG. 9(a). Besides, the crystal silicon film 15 can also be formed by the low pressure CVD method or the sputtering method.

The Al$_2$O$_3$ film formed as described above orients preferentially to the plane (012), and the crystal silicon film 15 thereon orients preferentially to the plane (100).

Next, a SiO$_2$ film 16 which becomes a gate insulator is formed in a thickness of 100 nm on the crystal silicon film 15 in the reaction chamber C$_2$ of the plasma CVD apparatus as shown in FIG. 9(c). The growth conditions thereof are such that the substrate temperature is set to 300° C., and SiH$_4$ and N$_2$O are introduced into the reaction chamber C$_2$ at flow rates of 20 sccm and 2,000 sccm, respectively. Further, the discharge power for plasma generation is set to 100 W, the discharge hour is set to 5 minutes, and the pressure in the reaction chamber C$_2$ is set to 0.3 Torr. The SiO$_2$ film 16 may be formed by the CVD method or the sputtering method.

Next, the glass substrate 1 is taken out of the reaction chamber C$_2$ of the plasma CVD apparatus, and a molybdenum (Mo) film 17 having a film thickness of 50 nm is by the sputtering method as shown in FIG. 9(d). Patterning is applied to the film 17 by the photolithography method so as to form a gate electrode 18 as shown in FIG. 9(e). Furthermore, after the gate electrode 18 is formed, patterning is applied also to the SiO$_2$ film 16 continuously by changing the etching gas.

Thereafter, a source layer 19 and a drain layer 20 are formed by means of ion implantation of phosphorus with the gate electrode 18 as a mask. Then, a SiO$_2$ film 21 which becomes an interlayer insulator is formed in a thickness of 300 nm by the CVD method or the like, and thereafter, patterning is applied to the SiO$_2$ film 21 by the photolithography method so as to form contact holes 21a and 21b on the source layer 19 and the drain layer 20 as shown in FIG. 9(f).

Lastly, an Al film is formed in a thickness of 100 nm by the sputtering method, and a source electrode 22a and a drain electrode 22b are formed as shown in FIG. 9(g) by applying patterning to the Al film by the photolithography method, thus completing a TFT.

In this TFT, Si$_3$N$_4$, SiON and SiO$_2$ are congenial to Al$_2$O$_3$, adhesion of the Al$_2$O$_3$ film 14 to the foundation surface thereof is improved and an initial state of film formation having a large influence upon the film quality is also improved. Thus, the plane (012) orients preferentially more easily and the film quality of the crystal silicon film 15 formed thereon is further improved, thus improving characteristics of the TFT.

The Al$_2$O$_3$ film 14 in this embodiment may be formed by the first or the third embodiment.

(5) The sixth embodiment (A method for manufacturing a third planar type silicon TFT)

FIG. 10(a) to FIG. 10(f) are sectional views for explaining a process of manufacturing a third planar type TFT as a sixth embodiment of the present invention.

Figure 10:
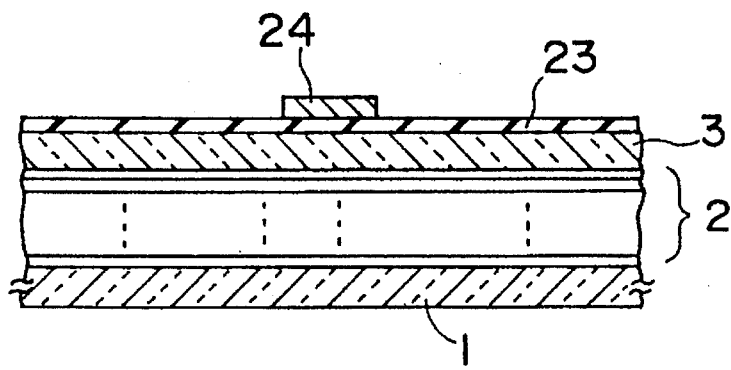
FIG. 10(a) to FIG. 10(f) are sectional views showing a process of manufacturing a third example of a planar type silicon thin film transistor.
Figure 10:
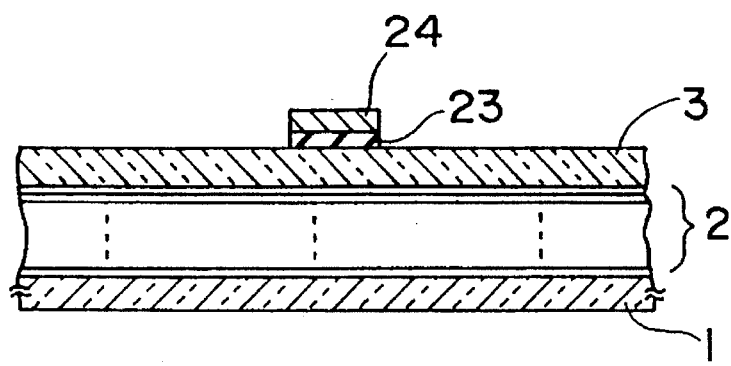
Figure 10:
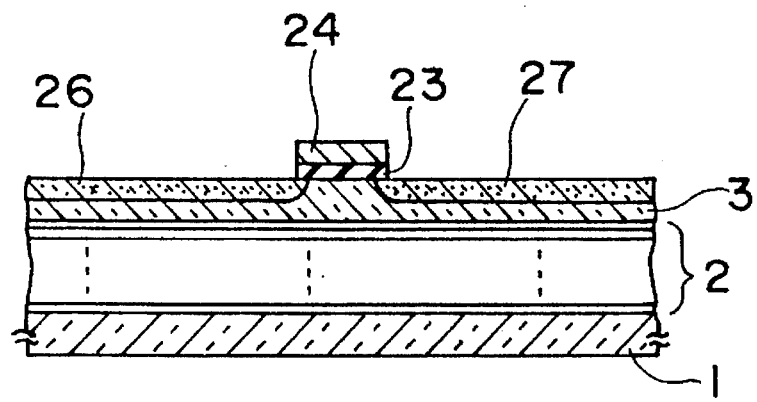
Figure 10:
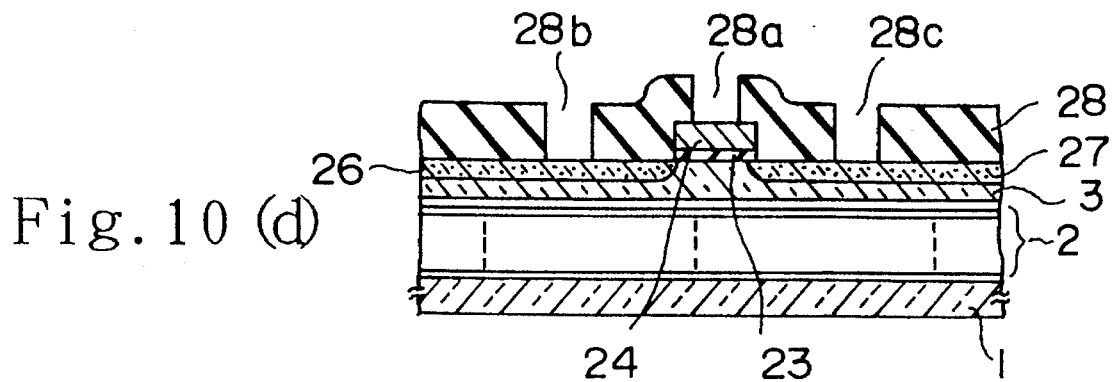
Figure 10:
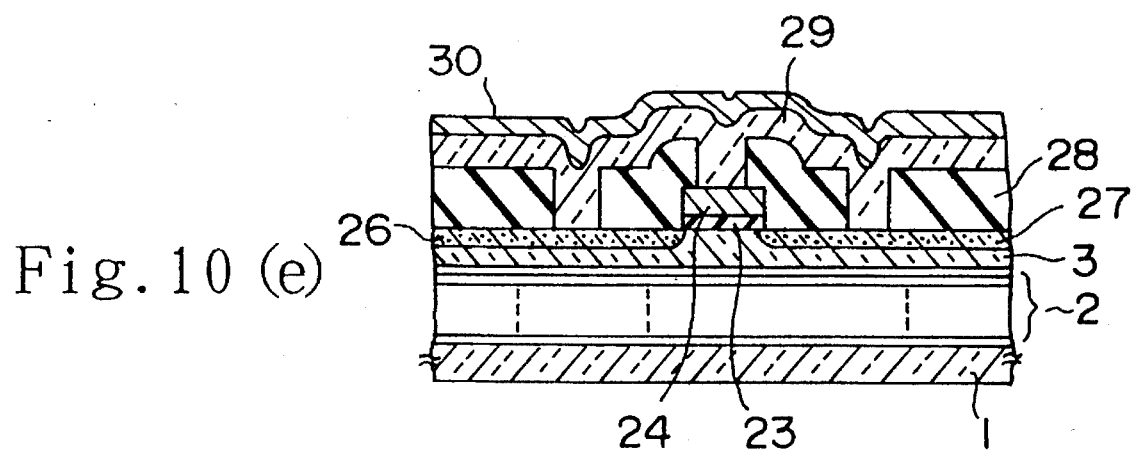
Figure 10:
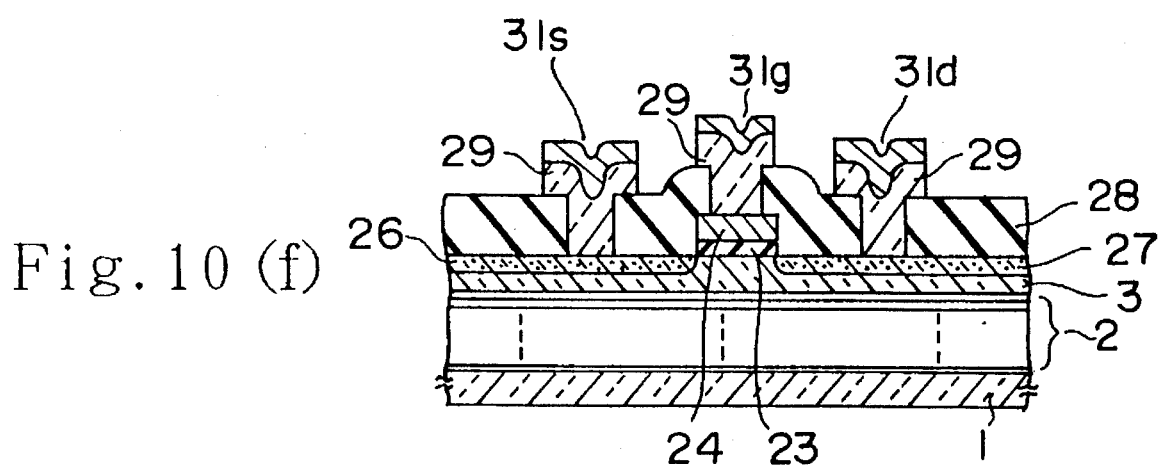

First, as shown in FIG. 10(a), an Al$_2$O$_2$ film 2 having a film thickness of 400 nm is laminated on the glass substrate 1 by the ALD method described previously, and then a crystal silicon film 3 having a film thickness of 100 nm is deposited by the plasma CVD method without breaking the vacuum state. These films are grown according to the above-described method of the first, the second or the third embodiment.

Following to the growth of the crystal silicon film 3, a SiO$_2$ film (gate insulator) 23 having a film thickness of 100 nm is laminated by means of the plasma CVD apparatus shown in FIG. 1. The conditions of film formation are almost the same as the growth conditions of the SiO$_2$ film 6 in the fourth embodiment.

Further, after taking out the glass substrate 1 of the plasma CVD apparatus, a Cr film having a film thickness of 100 nm is deposited on the SiO$_2$ film 23 by the sputtering method. Furthermore, patterning is applied to this Cr film by the photolithography method so as to form a gate electrode 24.

Next, the SiO$_2$ film 23 around the gate electrode 4 is etched with the gate electrode 24 as a mask, thereby to expose the crystal silicon layer 3 as shown in FIG. 10(b). Then, ion implantation of phosphorus is made into the crystal silicon film 3 on both sides of the gate electrode 24. The dose thereof is at $1 \times 10^{13}$/cm$^2$, and the acceleration voltage is at 15 KeV.

With this, impurity areas formed on both sides of the gate electrode 24 become a source layer 26 and a drain layer 27 of the TFT as shown in FIG. 10(c), and the carrier density thereof is at $5 \times 10^{16}$/cm$^3$.

Thereafter, isolation is made by applying patterning to the crystal silicon layer 3 by the photolithography method.

Then, a SiO$_2$ film 28 is formed in a thickness of 500 nm as an interlayer insulator by the CVD method, and openings 28a, 28b and 28c for contact are formed on the gate electrode 24 and on the source layer 26 and the drain layer 27 as shown in FIG. 10(d).

Thereafter, a polycrystal silicon film 29 doped with phosphorus is formed in a thickness of 500 nm by the plasma CVD method as shown in FIG. 10(e).

The forming conditions thereof are such that the substrate temperature is set to 400° C., SiH$_4$, PH$_3$ and H$_2$ are introduced into the reaction chamber at flow rates of 5 sccm, 0.15 sccm end 495 sccm, respectively, and also the pressure in the chamber is set to 100 Pa. With this, the carrier density in the polycrystal silicon film 29 reaches $1 \times 10^{18}$/cm$^3$.

Next, an aluminum film 30 is deposited in a thickness of 100 nm by the sputtering method, and then patterning is applied to the aluminum layer 30 by the photolithography method, thereby to form a gate outlet electrode 31g, a source electrode 31s and a drain electrode 31d connected to the gate electrode 24, the source layer 26 and the drain layer 27 through the openings 28a, 28b and 28c as shown in FIG. 10(f). Etching in the case of the patterning is performed by a reaction ion etching method.

When patterning is applied to the aluminum layer 30, the polycrystal silicon film 29 is also etched successively so as to form the same pattern. With this, a planar type TFT is completed.

In the present embodiment, the source layer 26 and the drain layer 27 both have a low impurity density, and the polycrystal silicon film 29 of a high impurity density is made to lie between these layers and the source electrode 31s and the drain electrode 31d.

As against the above, if the source layer 26 and the drain layer 27 are made to have a high impurity density, the electric field is enlarged in the vicinity of the drain layer 27, and the OFF-state current due to field emission or tunnel is increased. Since the electric field strength in the vicinity of the drain layer 27 is determined by the impurity doping quantity of the drain layer 27, the OFF-state current can be reduced by making the impurity doping quantity smaller.

However, the carrier density has to be high in order to make the contact resistance with the electrode 31d connected to the drain layer 27 smaller. Accordingly, the impurity density reaches the highest at the contact portion with wiring, and it is sufficient to perform ion implantation that the impurity density is reduced as parting from the contact portion, but it is practically difficult to regulate the density by means of ion implantation.

As against the above, when the polycrystal silicon film 29 containing impurities of high density is formed between the source layer 26 and the drain layer 27 both having a low impurity density and the source electrode 31s and the drain electrode 31d as in the present embodiment, the contact resistance at the contact portion between the drain layer 27 and a wiring pattern 31 can be reduced simply without impurity ion implantation.

Figure 11:
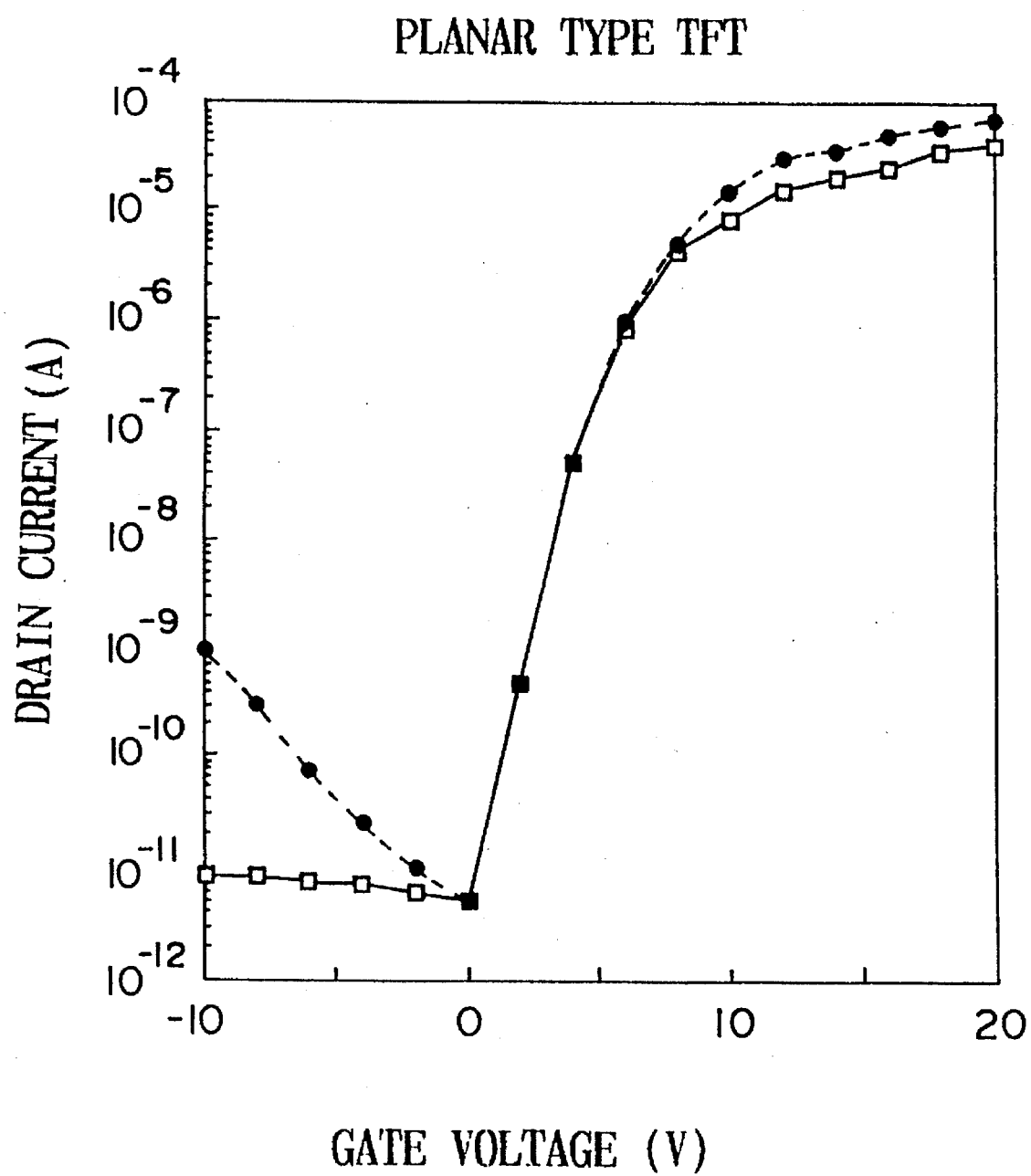
FIG. 11 is a characteristic diagram of a planar type silicon thin film transistor in the third example.

As a result, characteristics shown in FIG. 11 are obtainable, and it has been found that the OFF-state current is reduced without lowering the ON-state current according to the present embodiment. In the figure, the solid line shows the case of the present embodiment, and the broken line shows a case when source and drain electrodes are formed of aluminum only without providing the polycrystal silicon film 29.

Now, the $Al_2O_3$ film 2 is formed directly on the glass substrate 1 in the present embodiment, but the film quality of $Al_2O_3$ is improved when a foundation insulator such as SiN, $SiO_2$ or SiON is placed between the $Al_2O_3$ film 2 and the glass substrate 1 in a similar manner as the fifth embodiment.

Further, the impurity density of the polycrystal silicon film under the wiring pattern 31 is made uniform in the present embodiment, but it may also be arranged so that the impurity density is increased as getting near to the electrode side by changing the flow rate of impurity containing gas.

Besides, even if the crystal silicon film 3 which becomes an active semiconductor layer is formed directly on the glass substrate or on a film of SiN, SiON, $SiO_2$ or the like without having a film formed of a binary system material lie therebetween, the ON-state current is lowered similarly when polycrystal silicon containing impurities of high density is formed between the source and drain layer and the electrodes.

Besides, in the present embodiment, it is a matter of course that the OFF-state current is reduced even if a polycrystal silicon film is used in place of the crystal silicon film which becomes an active semiconductor layer.

(7) The seventh embodiment (A method for manufacturing a fourth planar type silicon TFT)

Figure 12:
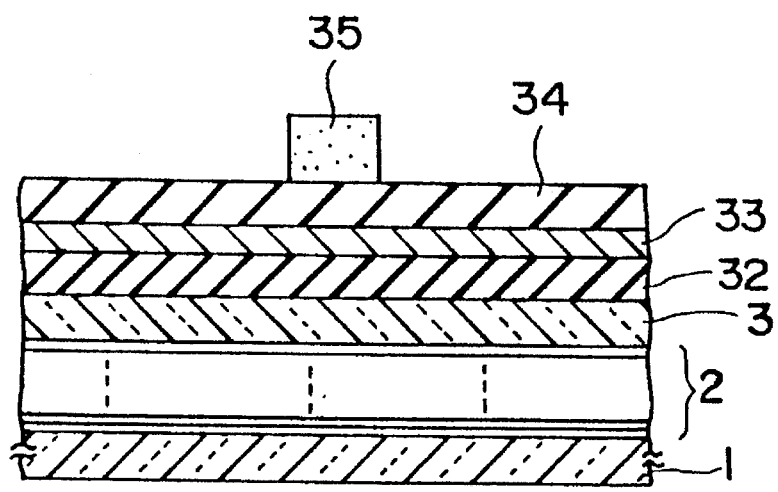
FIG. 12(a) to FIG. 12(e) are sectional views showing a process of manufacturing a fourth example of a planar type silicon thin film transistor.
Figure 12:
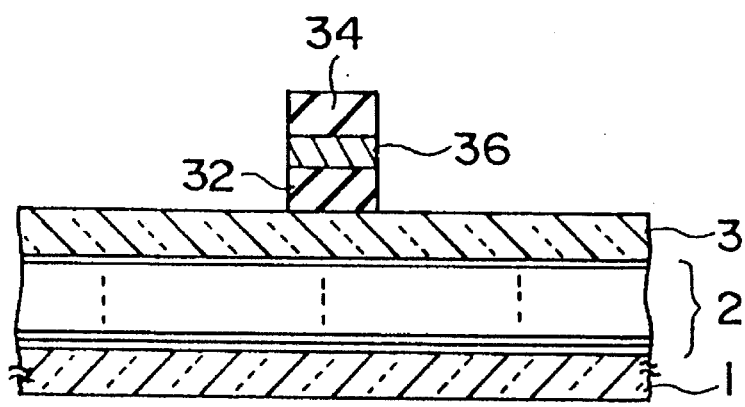
Figure 12:
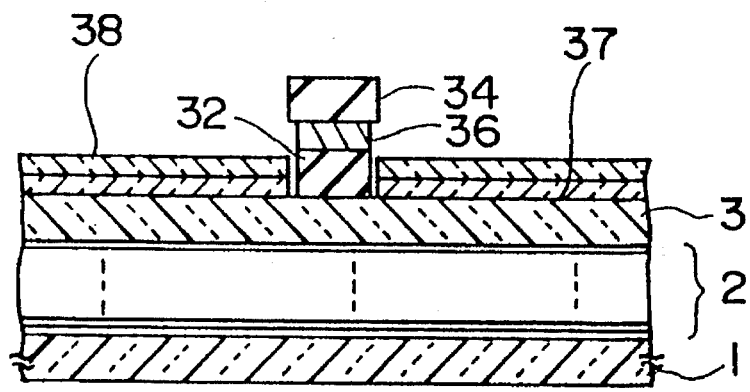
Figure 12:
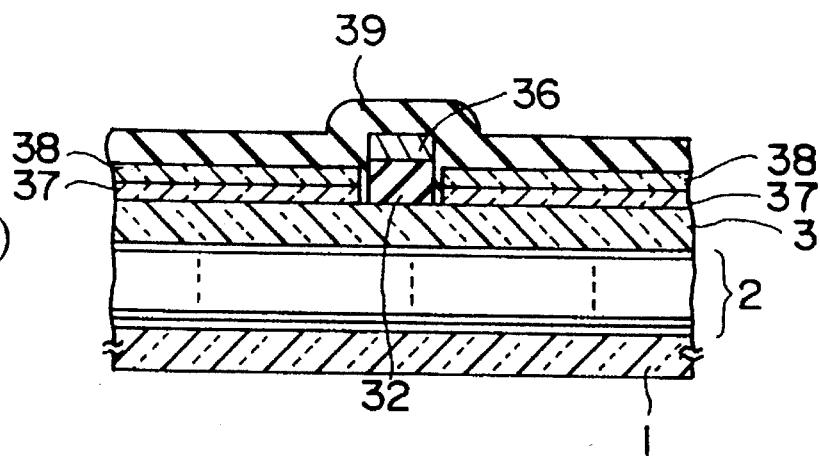
Figure 12:
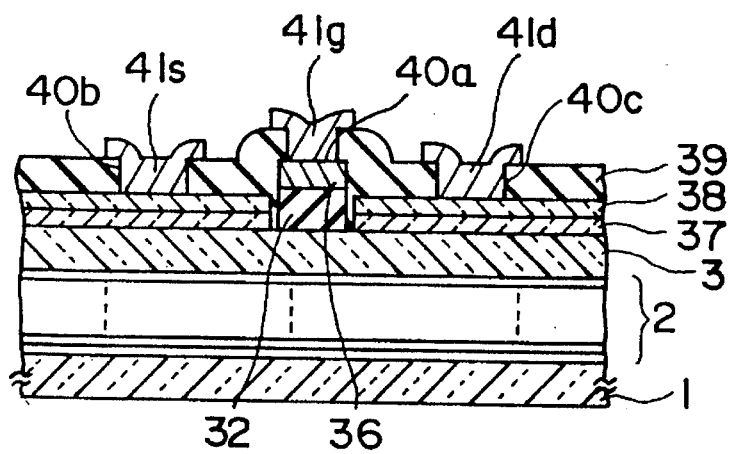

FIG. 12 shows sectional views showing the process in manufacturing a fourth planar type TFT which is a seventh embodiment of the present invention.

First, description will be made until the sectional state shown in FIG. 12(a) is reached.

Namely, an $Al_2O_3$ film 2 having a thickness of 400 nm is formed on a glass substrate 1 by the ALD apparatus using the film forming apparatus shown in FIG. 1. Further, a crystal silicon film 3 is deposited in a thickness of 100 nm thereon by the plasma CVD apparatus, and a $SiO_2$ film 32 is grown in a thickness of 100 nm in succession as a gate insulator. Then, a Cr film 33 is deposited in a thickness of 100 nm by the sputtering method.

The process up to this point is similar to that sixth embodiment, and a film is formed under the same conditions.

Thereafter, a SiN film 34 is formed further in a thickness of 200 nm by the CVD method as an insulating film for silicon selective formation.

Then, photoresist 35 is applied, and a pattern for a gate electrode is formed by exposing and developing the photoresist 35.

Next, after removing the SiN film 34, the Cr film 33 and the $SiO_2$ film 32 in the area which is not covered by the pattern of the photoresist 35 by means of continuous etching, the photoresist 35 is removed. With this, the Cr film 33 applied with patterning becomes a gate electrode 36 as shown in FIG. 12(b).

Then, after side etching is applied to the gate electrode 36 using $Ce(NO_3)_4.2NH_4NO_3.xH_2O$ solution, side etching is also applied to the $SiO_2$ film 32 under the gate electrode 36 using a buffer hydrofluoric acid solution. With this, a state that the SiN film 34 overhangs from the gate electrode 36 is presented.

Then, is shown in FIG. 12(c), two layers of polycrystal silicon 37 and 38 doped with phosphorus are deposited selectively on the crystal silicon film 3 on both sides of the gate electrode 36 by means of a plasma CVD apparatus such as shown in FIG. 1 in accordance with selective forming conditions. In this case, since the SiN film 34 on the gate electrode 36 shows an overhanging state, formation of the polycrystal silicon films 37 and 38 on the end surfaces of the gate electrode 36 is controlled, thus maintaining good insulation between the gate electrode 36 and the polycrystal silicon films 37 and 38.

The first polycrystal silicon film 37 grows in a thickness of 25 nm. The growth conditions thereof are such that the substrate temperature is set to 400° C., $SiH_4$, $SiF_4$, $PH_3$, and $H_2$ are introduced into the reaction chamber of the film forming apparatus at flow rates of 1 sccm, 10 sccm, $1\times10^{-4}$ sccm and 59 sccm, respectively, the pressure in the chamber is set to 0.5 Torr, and the discharge power between electrodes is set to 200 W. With this, the impurity density of the first polycrystal silicon film 37 becomes $5\times10^{15}/cm^3$.

Further, the second polycrystal silicon film 38 is also deposited in a thickness of 25 nm. The growth and forming conditions thereof are such that the substrate temperature is set to 400° C., $SiH_4$, $SiF_4$, $PH_3$ and $H_2$ are made to flow into the reaction chamber at flow rates of 1 sccm, 10 sccm, $3\times10^{-2}$ sccm and 59 sccm, respectively, and further, the pressure in the chamber is set to 0.5 Torr and the discharge power is set to 200 W. With this, the carrier density of the second polycrystal silicon film 38 becomes $1\times10^{18}/cm^3$.

Thereafter, although it is not illustrated, patterning is applied to the crystal silicon film 3 and the polycrystal silicon films 37 and 38 successively by the photolithography method, thereby to perform isolation.

Next, after removing the SiN film 34 for selective formation by phosphoric acid, a SiO$_2$ film 39 is formed in a thickness of 400 nm as an interlayer insulator as shown in FIG. 12(d).

Then, patterning is applied to the SiO$_2$ film 39 by the photolithography method, thereby to form three openings 40a, 40b and 40c on the gate electrode 36 and on the second polycrystal silicon films 37 and 38 on both sides thereof.

Next, an aluminum film is formed, and patterning is applied to this aluminum film so as to form a gate outlet electrode 41g on the gate electrode 36, and further, to form a source electrode 41s and a drain electrode 41d connected to the second polycrystal silicon film 38 on both sides of the electrode 41g as shown in FIG. 12(e).

With this, a planar type TFT is completed.

Now, in the present embodiment, since the contact layer under the source and drain electrodes is formed of the polycrystal silicon films 37 and 38 by the CVD method, the impurity density thereof can be controlled with high precision, and in addition, the regulation thereof is easy.

Further, the polycrystal silicon film 38 which makes contact with the source electrode 41s and the drain electrode 41d has high impurity density, and the contact resistance is reduced by this film 38.

Figure 13:
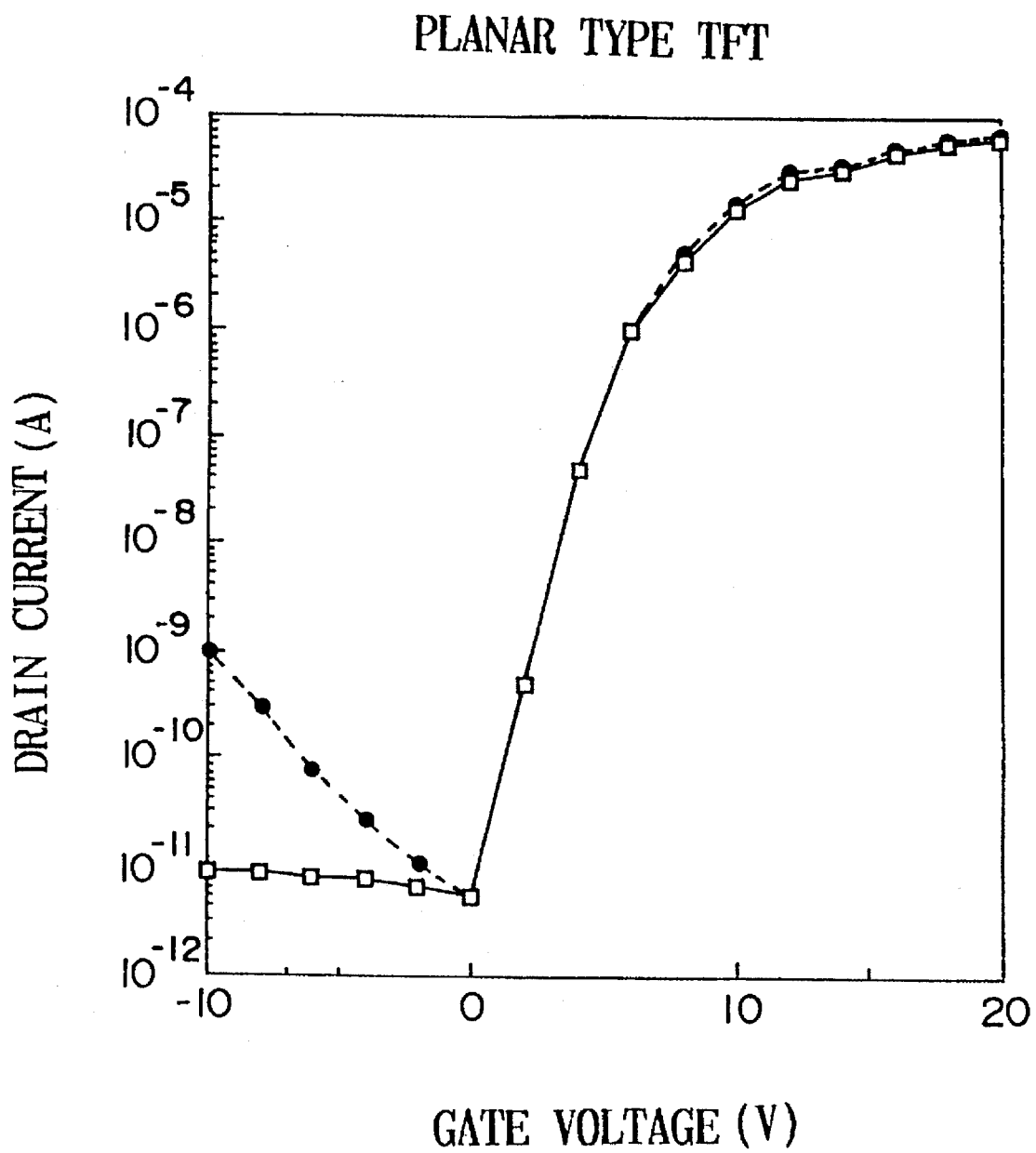
FIG. 13 is a characteristic diagram of a planar type silicon thin film transistor in the fourth example.

Furthermore, the polycrystal silicon film 37 connected to the crystal silicon 3 has low impurity density. Thus, the electric field strength in the vicinity of the drain is suppressed, and the OFF-state current is reduced. As compared with a prior art TFT in which ion implantation is performed at high impurity density, the results as shown in FIG. 13 were obtained. According to the results, no change was noticed in the ON-state current as compared with a TFT of a prior art.

Besides, in the explanation described above, the SiN film 34 is made overhang from the electrode 36, but these may be formed into a configuration having the same size. In this case, the insulator on the gate electrode may be a SiO$_2$ film instead of the SiN film.

Further, the Al$_2$O$_3$ film is formed directly on the glass substrate i in the present embodiment, but the film quality of the Al$_2$O$_3$ and the crystal silicon film is improved if a SiN film, a SiON film, a SiO$_2$ film or the like is made to lie therebetween.

Furthermore, the density of the first polycrystal silicon film 37 and the second polycrystal silicon film 38 is changed in two steps, but it may also be arranged so that the density is increased gradually linearly or in a plurality of steps. In this case, it can be realized by increasing the flow rate of PH$_3$ gas linearly or step-wise. The detail of film forming conditions will be described in an 11th embodiment, hence description thereof is omitted here.

Besides, in the present embodiment, it is a matter of course that the OFF-state current is reduced even if a polycrystal silicon film is used in place of the crystal silicon film which becomes an active semiconductor layer.

(8) The eighth embodiment (A method for manufacturing a first inverted stagger type silicon TFT)

Next, an example of manufacturing a first inverted stagger type silicon thin film transistor will be described as an eighth embodiment.

FIGS. 14(a) to (d) are sectional views arranged in the order of a process of manufacturing an inverted stagger type silicon thin film transistor, and description will be made hereinafter with reference to these drawings.

Figure 14:
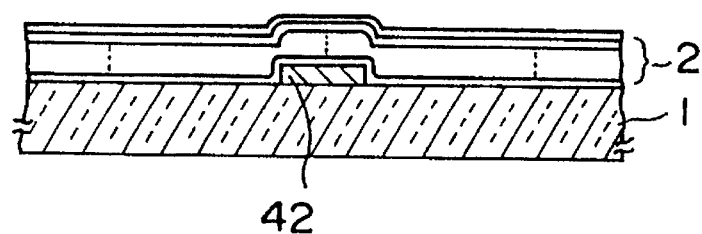
FIG. 14(a) to FIG. 14(d) are sectional views showing a process of manufacturing a first example of an inverted stagger type silicon thin film transistor.
Figure 14:
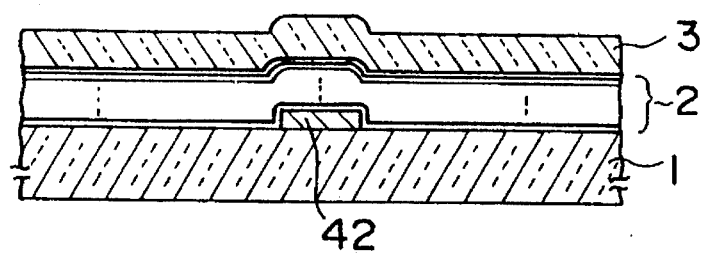
Figure 14:
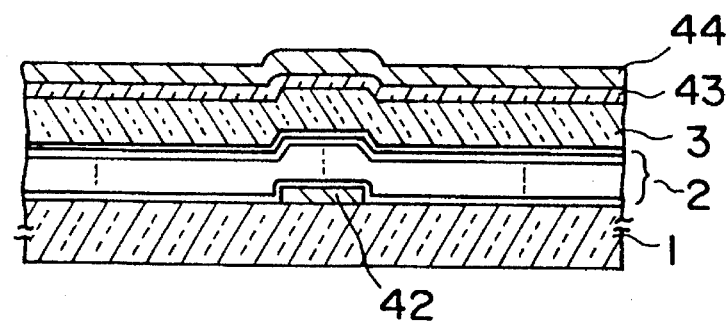
Figure 14:
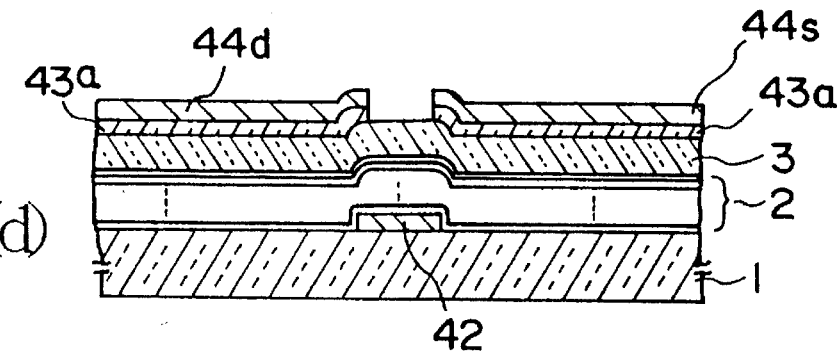

First, as shown in FIG. 14(a), molybdenum (Mo) having a thickness of 50 nm is deposited on a glass substrate 1 by sputtering method, and a gate electrode 42 formed through a photo-etching process. The glass substrate 1 and the gate electrode 42 become a base substance W on which an Al$_2$O$_3$ film is formed.

The base substance W is arranged in a reaction chamber C$_1$ of the atomic layer deposition apparatus shown FIG. 1. The base substance W is attached to a mechanism (not illustrated) which moves left and right across a layer where argon barrier gas is Hereafter, an Al$_2$O$_3$ film 2 having a thickness of 400 nm was formed on the base substance W in the same manner as the first embodiment. The last step of the growth was through an aluminum trichloride vapor ambience, and the uppermost surface of the Al$_2$O$_3$ film 2 was formed into an aluminum layer. This Al$_2$O$_3$ film 2 becomes a gate insulator.

Then, a load lock L was opened so as to convey the base substance W to a reaction chamber C$_2$ of the plasma CVD apparatus, and a crystal silicon film 3 having a thickness of 100 nm was obtained on the Al$_2$O$_3$ film 2 similarly to the above-described first embodiment thereafter as shown in FIG. 14(b).

Next, an n$^+$-Si film 43 having a thickness of 50 nm which becomes a contact layer is formed by the plasma CVD method as shown in FIG. 14(c). The forming conditions are such that silane flow rate is set to 30 sccm, hydrogen flow rate is set to 500 sccm, phosphine flow rate is set to 1 sccm, the pressure is set to 1 Torr, the discharge power 1s set to 200 W, and discharge hour is set to 5 minutes.

Then, a Ti film 44 having a thickness of 100 nm which becomes source and drain electrodes is formed by the sputtering method. The forming conditions are such that T1 is used for a target, Ar is introduced into the reaction chamber at the flow rate of 50 sccm, the internal pressure is set to 0.3 Torr, the discharge power is set to 2 KW, and the discharge hour is set to 5 minutes.

Lastly, as shown in FIG. 14(d), the Ti film 44 and the n$^+$-Si film 43 are removed by reactive ion etching so as to form a contact layer 43a, a source electrode 44s and a drain electrode 44d. Furthermore, patterning is applied to the crystal silicon film 3 thereby to perform isolation.

An inverted stagger type silicon thin film transistor is completed in this manner, and a TFT having high mobility and good transistor characteristics was obtainable similarly to the fourth embodiment.

Moreover, no pin hole and no low resistance portion are produced in the Al$_2$O$_3$ film 2 which is formed by the ALD method and becomes a gate insulator, thus improving the reliability of elements.

Besides, since a crystal silicon film is exposed between the source electrode and the drain electrode, a process of covering that area with an insulating film is to be added after the crystal silicon film is formed. As to such a point, the same applies to the ninth to the 11th embodiments described hereinafter, hence repetitive description is omitted here.

(9) The ninth embodiment (A method for manufacturing a second inverted stagger type silicon TFT)

The inverted stagger type TFT described in the eighth embodiment includes an Al$_2$O$_3$ film formed on a gate electrode, but a film such as SiN, SiON or SiO$_2$ may also be used as the foundation of the Al$_2$O$_3$ film similarly to the fifth embodiment.

Figure 15:
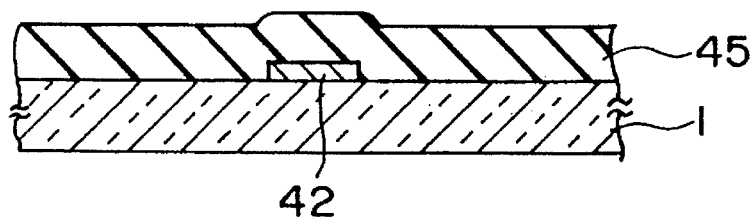
FIG. 15(a) to FIG. 15(d) are sectional views showing a process of manufacturing a second example of an inverted stagger type silicon thin film transistor.
Figure 15:
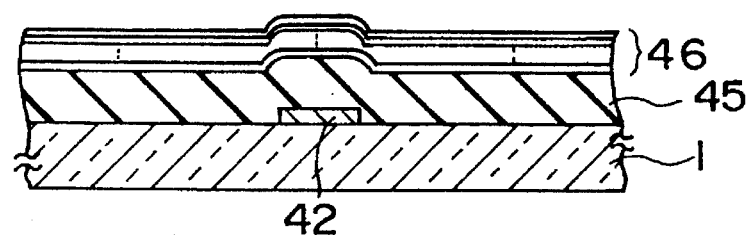
Figure 15:
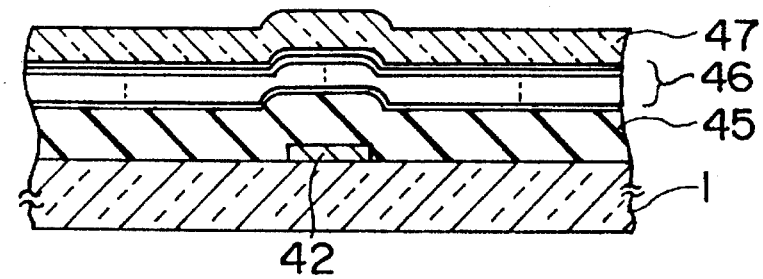
Figure 15:
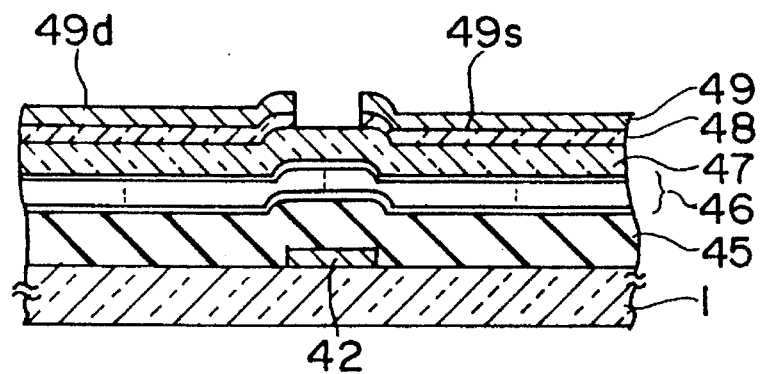

Now, a process of forming a second inverted stagger type TFT including a process of forming a SiN film as a foundation of the Al$_2$O$_3$ film will be described with reference to FIG. 15 as a ninth embodiment.

First, similarly to the eighth embodiment, after a gate electrode 42 is formed on a glass substrate 1, a SiN film 45 is formed in a thickness of 300 nm on the glass substrate 1 by the plasma CVD method under similar conditions to those in the fifth embodiment. With this, a section shown in FIG. 15(a) is obtained.

Then, similarly to the fifth embodiment, the glass substrate 1 is moved to the reaction chamber $C_1$ of the atomic layer deposition apparatus, and a single crystal or polycrystal $Al_2O_3$ film 46 having a film thickness of 50 nm is formed on the SiN film 45 under similar conditions to those in the fifth embodiment. In succession, the glass substrate 1 is conveyed to a reaction chamber $C_2$ of the plasma CVD apparatus without breaking the vacuum state, and a crystal silicon film 47 is formed in a thickness of 100 nm under similar conditions to those in the fifth embodiment as shown in FIG. 15(c). Here, the uppermost surface of the $Al_2O_3$ film 46 is formed of AS similarly to what was described in the second embodiment.

At least a part of the $Al_2O_3$ film 46 thus formed orients preferentially to the plane (012), and the crystal silicon film 47 thereon orients preferentially to the plane (100).

Next, as shown in FIG. 15(d), an $n^+$-Si film 48 having a thickness of 50 nm which becomes a contact layer is formed by the plasma CVD method. Furthermore, a Ti film 49 having a thickness of 1,000 Å which becomes source and drain electrodes is formed by the sputtering method. The forming conditions for these films are set as shown in the eighth embodiment.

Lastly the Ti film 49 and the $n^+$-Si film 48 located in the area above the gate electrode 42 are removed by etching selectively by the reactive ion etching method, thereby to form a source electrode 49s and a drain electrode 49d.

An inverted stagger type TFT is completed in this manner. Since, the $Al_2O_3$ film 46 is formed with the SiN film 45 as a foundation in that TFT, the film quality of crystal silicon is further improved as described in the fifth embodiment, and transistor characteristics including mobility larger than that in the eighth embodiment are obtainable.

(10) The tenth embodiment (A method for manufacturing a third inverted stagger type silicon TFT)

Next, a process of manufacturing a third inverted stagger type TFT which reduces a leakage current will be described as a tenth embodiment.

Figure 16:
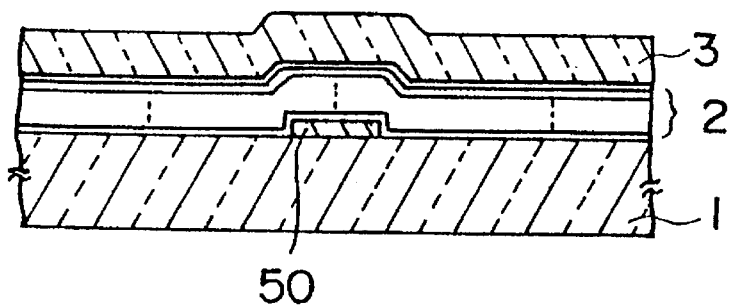
FIG. 16(a) to FIG. 16(c) are sectional views showing a process of manufacturing a third example of an inverted stagger type silicon thin film transistor.
Figure 16:
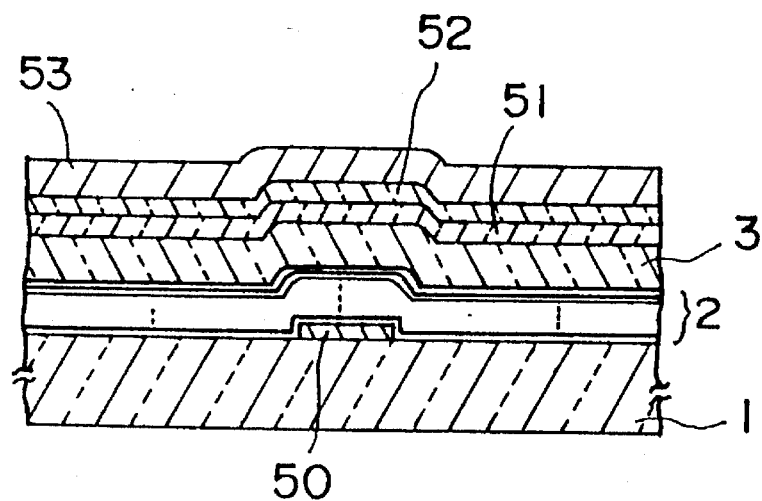
Figure 16:
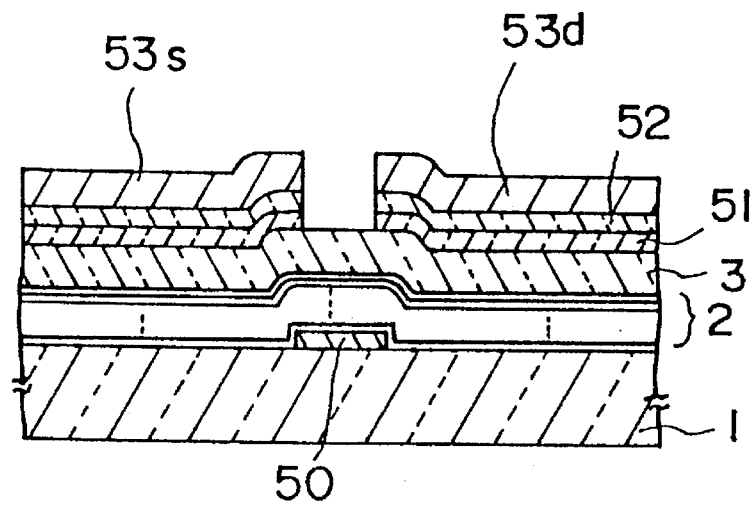

FIG. 16 shows sectional views arranged in the order of process of manufacturing an inverted stagger type silicon thin film transistor, and description will be made hereinafter with reference to these drawings.

First, as shown in FIG. 16(a), after a Cr film having a thickness of 50 nm is deposited on a glass substrate 1 by the sputtering method, a gate electrode 50 is formed by applying patterning to the Cr film by the photolithography method.

Next, an $Al_2O_3$ film 2 having a thickness of 400 nm is formed on the glass substrate 1 under the similar conditions to those in the first embodiment using the film forming apparatus shown In FIG. 1. Thereafter, a crystal silicon film 3 having a film thickness of 100 nm is grown on the $Al_2O_3$ film 2 by a plasma CVD apparatus without breaking the vacuum state.

The growth conditions of the crystal silicon film 3 are such that the substrate temperature is set to 400° C., $SiH_4$ and $H_2$ are introduced at flow rates of 5 sccm and 495 sccm, respectively, and further, the pressure in the reaction chamber $C_2$ is set to 100 Pa and the discharge power between electrodes is set to 200 W.

Following to the above, a first doped polycrystal silicon film 51 having a thickness of 50 nm is formed in the same plasma CVD apparatus as shown in FIG. 16(b). The growth conditions thereof are such that the substrate temperature is set to 400° C., $SiH_4$, $H_2$ and $PH_3$ are introduced at flow rates of 5 sccm, 495 sccm and $1\times10^{-4}$ sccm, respectively, and the pressure in the reaction chamber $C_2$ is set to 100 Pa and the discharge power between electrodes is set to 200 W.

Then, a second doped polycrystal silicon film 52 is grown. The growth conditions in this case are to be the same as those for the first doped polycrystal silicon film 51 except that the flow rate of $PH_3$ is set to $3\times10^{-2}$ sccm.

The carrier density of the first doped polycrystal silicon film 51 formed under such conditions becomes $5\times10^{16}/cm^3$, and the carrier density of the second doped polycrystal silicon film 52 becomes $1\times10^{18}/cm^3$.

Next, after the glass substrate 1 is taken out of the plasma CVD apparatus, a molybdenum (Mo) film 53 is formed in a thickness of 100 nm by the sputtering method.

Thereafter, patterning is applied to the Mo film 53 through the first polycrystal silicon film 51 continuously by the photolithography method using the reactive ion etching method. Thus, as shown in FIG. 16(c), the Mo film 53 is isolated above the gate electrode 50 so as to form a source electrode 53s and a drain electrode 53d, and the doped polycrystal silicon films 51 and 52 thereunder are used as contact layers in succession, patterning is applied to the crystal silicon film 3 so as to perform In the TFT thus formed, the $Al_2O_3$ film 2 serves as a gate insulator, thus obtaining a highly reliable gate insulator in which neither pin hole nor low resistance portion is produced. Further, high mobility can be realized by the crystal silicon film 3 having a large grain size. Furthermore, the electric field strength in the area in the vicinity of the drain is reduced by the change of the impurity density in the doped polycrystal silicon films 51 and 52, the current due to field emission and tunnel becomes hard to flow, the OFF-state current becomes smaller, and the contact resistance of the source and drain electrodes can be reduced.

Moreover, since the first and the second doped polycrystal silicon films 51 and 52 are formed on the crystal silicon film 3 which becomes an active semiconductor layer continuously by the plasma CVD method, the impurity density thereof is regulated with high controllability.

Figure 17:
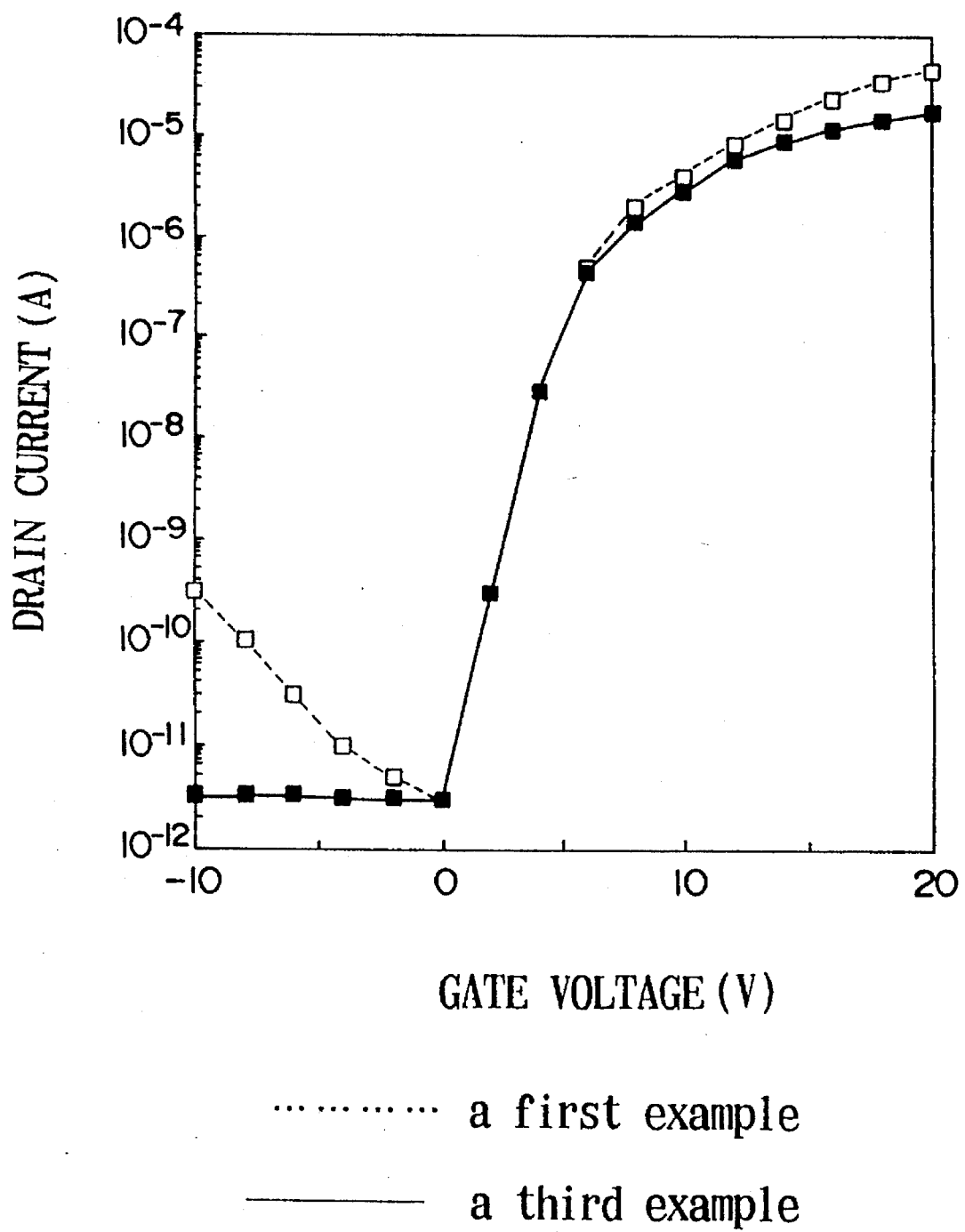
FIG. 17 is a characteristic diagram of an inverted stagger type silicon thin film transistor in the third example.

FIG. 17 is a diagram for comparing gate voltage to drain current characteristics of the inverted stagger type TFT in the eighth embodiment in which only a contact layer of high impurity density is provided and the stagger type TFT of the present embodiment in which the impurity density of the contact layer is changed by one set with each other, and it is noticed that the OFF-state current is reduced with the ON-state current kept suppressed according to the present invention.

Besides, in the present embodiment, it is a matter of course that the OFF-state current is reduced even if a polycrystal silicon film is used in place of the crystal silicon film which becomes an active semiconductor layer.

(11) The 11th embodiment (A method for manufacturing a fourth inverted stagger type silicon TFT)

In the above-described tenth embodiment, the crystal silicon film in the source and drain area and the source and drain electrodes are connected through a polycrystal silicon film in two layers each having different impurity density, but the impurity density distribution of a polycrystal silicon film is not necessarily limited thereto.

Therefore, a process of manufacturing a fourth inverted stagger type TFT including a polycrystal silicon film having another impurity density distribution will be described as an 11th embodiment.

Figure 18:
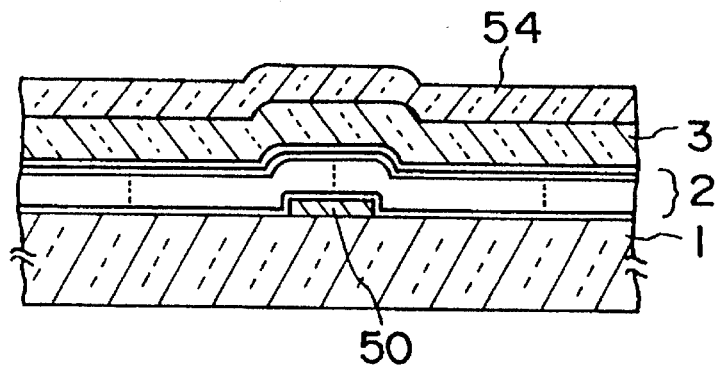
FIG. 18(a) to FIG. 18(c) are sectional views showing a process of manufacturing a fourth example of an inverted stagger type silicon thin film transistor.
Figure 18:
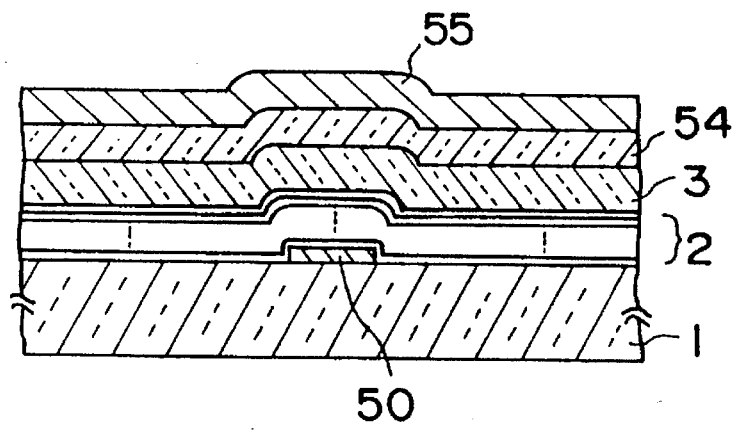
Figure 18:
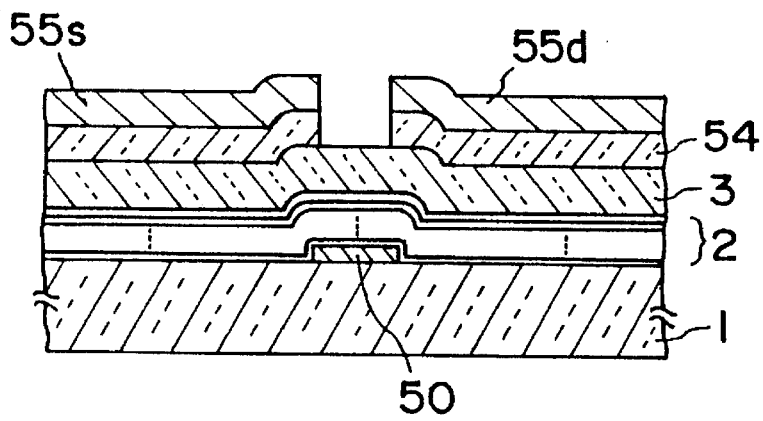

First, as shown in FIG. 18(a), a gate electrode 50 is formed on a glass substrate 1, and an $Al_2O_3$ film 2 and a crystal silicon film 3 are formed thereon successively similarly to the tenth embodiment. The film thickness and the growth conditions are set similarly to those for the tenth embodiment.

Then, after the crystal silicon film 3 is grown, a impurity containing crystal silicon film 54 doped with phosphorus is formed in a thickness of 100 nm using the same plasma CVD apparatus.

The conditions are such that the substrate temperature is set to 400° C., the pressure in the reaction chamber $C_2$ is set to 100 Pa, and the discharge power is set to 200 W. In this case, $SiH_4$ and $H_2$ are introduced at flow rates of 5 sccm and 495 sccm, respectively, as the gas to be introduced into the reaction chamber $C_2$, and the flow rate of $PH_3$ is introduced from the start of growth through the end of growth is changed 2 from $1\times10^{-4}$ sccm to $3\times10^{-2}$ sccm linearly or in a plurality of steps.

After the growth of the impurity containing silicon film 54 is thus completed, the glass substrate 1 is taken out of the reaction chamber $C_2$ of the plasma CVD apparatus.

Next, as shown in FIG. 18(b), after a Mo film 55 is formed on the impurity containing crystal silicon film 54 by the sputtering method, patterning is applied to the Mo film 55 through the impurity containing crystal silicon film 54 continuously similarly to the tenth embodiment, thereby to isolate them on the gate electrode 50 as shown in FIG. 18(c). With this, a source electrode 55s and a drain electrode 55d both composed of the Mo film 55 are formed, and these electrodes 55s and 55d are connected to the crystal silicon film 3 through the impurity containing crystal silicon film 54.

Next, patterning is applied to the crystal silicon film 3 so as to perform isolation, thus completing an inverted stagger type TFT.

According to the present embodiment, in the impurity containing crystal silicon film 54, the portion making contact with the source and drain electrodes 55s and 55d contains impurities of the highest density, and the impurity density is changed linearly or stepwise so that the density is lowered as approaching to the crystal silicon film 3.

Thus, the electric field strength in the vicinity of the drain area is reduced thereby to suppress the OFF-state current, and moreover, the contact resistance with the source and drain electrodes 55s and 55d is reduced. Further, such distribution of the impurity density can be controlled with high precision and easily since only the gas flow rate is regulated.

Figure 19:
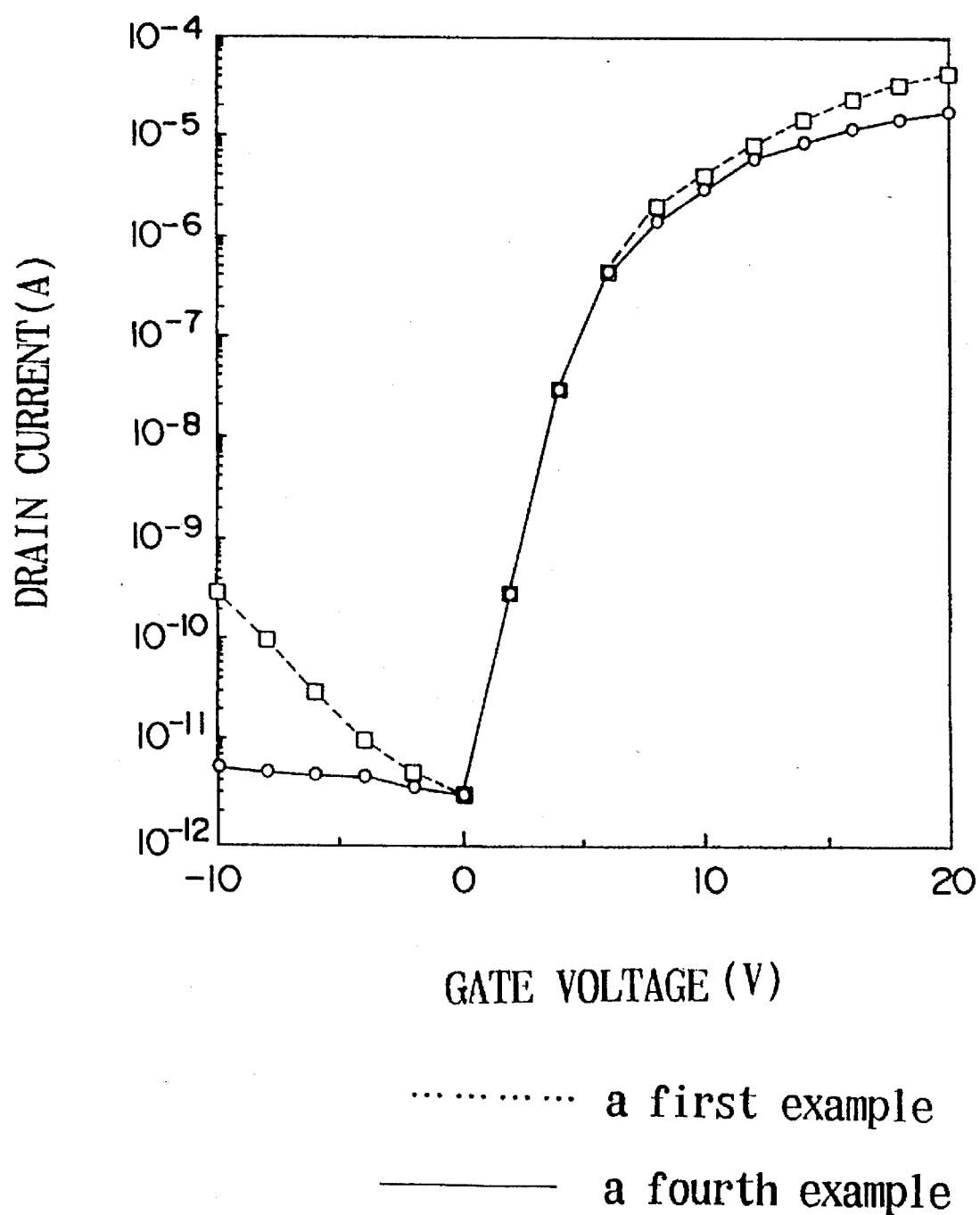
FIG. 19 is a characteristic diagram of an inverted stagger type silicon thin film transistor in the fourth example.

FIG. 19 is a diagram for comparing the gate voltage to drain current characteristics of the inverted stagger type TFT in the eighth embodiment in which only a contact layer of high impurity density is provided and the inverted stagger type TFT of the present embodiment in which the impurity density of the contact layer is changed linearly or in a plurality of steps so as to increase the density as approaching to the electrode with each other, and the OFF-state current can be reduced while keeping the ON-state current as suppressed according to the present embodiment.

Besides, any of a SiN film, a SiON film and a $SiO_2$ film may be made to lie under the $Al_2O_3$ film in both the tenth embodiment and the present embodiment, and as a result, the film quality of the crystal silicon film is further improved.

Besides, in the present embodiment, it is a matter of course that the OFF-state current is reduced even if a polycrystal silicon film is used in place of the crystal silicon film which becomes an active semiconductor layer.

(12) The 12th embodiment (A method for manufacturing a first stagger type silicon TFT)

In the above-described fourth to the 11th embodiments, an $Al_2O_3$ film was used for the foundation of the crystal silicon film, but it is also possible to apply a binary system semiconductor material such as GaP and AlP described in the first embodiment.

Now, a stagger type TFT applied with such a material will be described citing an example.

Figure 20:
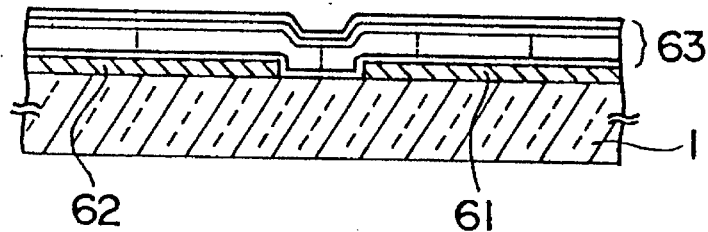
FIG. 20(a) to FIG. 20(d) are sectional views showing a process of manufacturing a first stagger type silicon thin film transistor.
Figure 20:
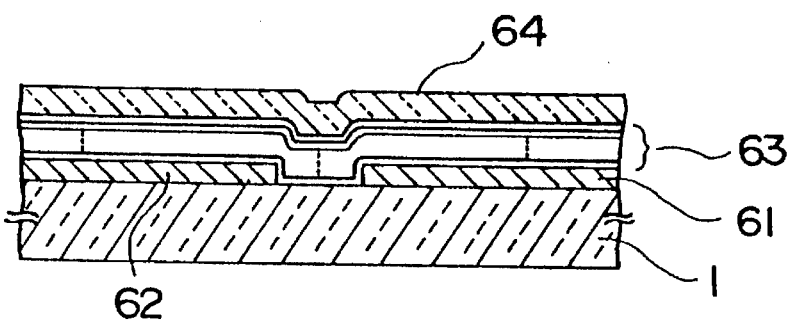
Figure 20:
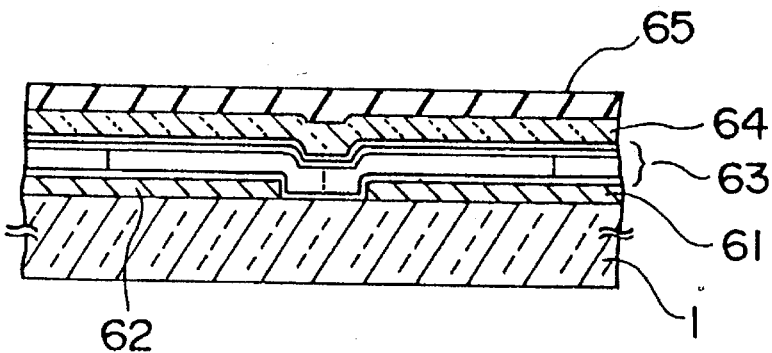
Figure 20:
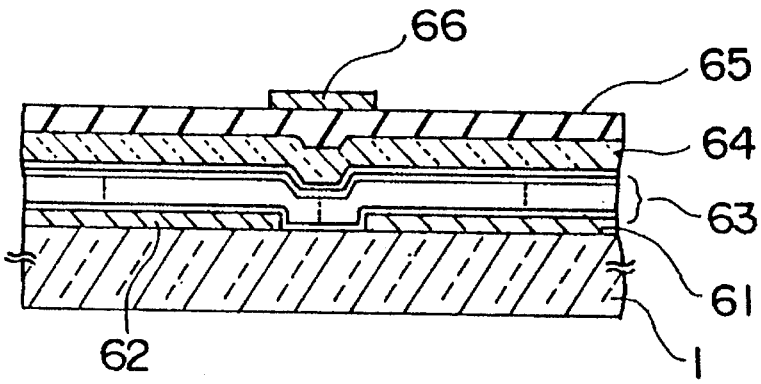

FIG. 20 shows sectional views showing a process of forming a stagger type TFT according to a 12th embodiment.

First, after an Al film having a film thickness of 50 nm is formed on a glass substrate 1 by the sputtering method, patterning is applied to the Al film by a photolithography method so as to form a source electrode 61 and a drain electrode 62.

Next, the glass substrate 1 is placed in the reaction chamber $C_1$ of the atomic layer deposition apparatus such as shown in FIG. 1, and attached to a mechanism (not illustrated) which moves left and right reciprocatingly across a gas layer where argon gas is flowing.

Then, the substrate is heated to the temperature of 400° C., exhaustion is performed by a turbo pump $P_1$ until $5\times10^{-7}$ Torr is reached, the valve $V_1$ is opened so as to flow argon gas at 500 sccm, and the orifice valve OF is regulated so as to reach 0.01 Torr, thereby to produce a stationary flow of argon gas. Thereafter, the valve $V_2$ is opened so as to introduce $Ga(CH_3)_3$ through the gas inlet port $N_2$, and then, the valve $V_3$ is opened so as to introduce $PH_3$ through the gas inlet port $N_3$. In this case, $Ga(CH_3)_3$ and $PH_3$ are not mixed with each other by means of the stationary flow of argon gas. The degree of vacuum in the reaction chamber $C_1$ is maintained at 0.01 Torr at this time.

With this, $Ga(CH_3)_3$ and $PH_3$ are supplied alternately at an interval of purging hour onto the topside of the glass substrate 1. The supply hour thereof is set to one second, respectively, and the purging hour is at 5 seconds.

A GaP layer 63 having a film thickness of 50 nm is formed as shown in FIG. 20(a) by repeating such supply 200 times.

Then, the glass substrate 1 is moved to the reaction chamber $C_2$ of the plasma CVD apparatus through the load lock L without breaking the vacuum state, and a crystal silicon film 64 is laminated in a thickness of 100 nm with the GaP layer 63 as the foundation as shown in FIG. 20(b). The silicon film forming conditions in this case are such that the substrate temperature is 400° C., $SiH_4$ at 10 sccm, $H_2$ at 500 sccm, the pressure at 0.5 Torr, the discharge power at 200 W, and the discharge hour at 30 minutes.

Next, a $SiO_2$ film 65 which becomes a gate insulator is grown in a thickness of 100 nm by the plasma CVD method as shown in FIG. 20(c). The growth conditions of the $SiO_2$ film 65 are such that, the substrate temperature is set to 300° C., $SiH_4$ and $N_2O$ are supplied at flow rates of 20 sccm and 2,000 sccm, respectively, the pressure in the reaction chamber $C_2$ is set to 0.3 Torr, the discharge power for plasma generation is set to 100 W, and the discharge hour is set to 5 minutes.

Thereafter, a molybdenum (Mo) film is formed in a thickness of 50 nm by the sputtering method, patterning is applied to the Mo film by the photolithography method, and the Mo film is made to remain in an area between a source electrode 61 and a drain electrode 62 as shown in FIG. 20(d) and used as a gate electrode. Thus, a stagger type TFT is completed.

In this stagger type TFT, the GaP film 63 is formed by the above-described method as the foundation of the crystal silicon film 64 forming a channel area. Since the GaP film 63 has high orientation property and further a lattice constant very close to that of silicon, the crystal silicon film 64 which grows thereon has a large crystal grain of approximately 200 nm. As a result, the mobility of carriers passing through the channel region of the silicon film 64 becomes larger as compared with a case in which the GaP film 63 is not provided, thus improving transistor characteristics.

Besides, that which is formed of a binary system semiconductor material such as AlP having a lattice constant close to that of silicon by the atomic layer deposition method after increasing the orientation property may be used for the foundation of the crystal silicon film 64 other than GaP.

Further, the film forming method for the above-described crystal silicon film 64 and the SiO$_2$ film 65 for a gate insulator is not limited to the plasma CVD method, but those films may also be formed by the low pressure CVD method, the sputtering method or the like.

(13) The 13th embodiment (A method for manufacturing a second stagger type silicon TFT)

Figure 21:
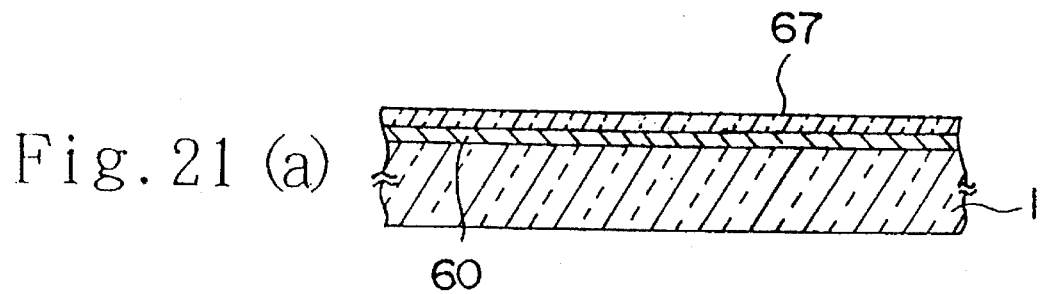
FIG. 21(a) to FIG. 21(d) are sectional views showing a process of manufacturing a second stagger type silicon thin film transistor.
Figure 21:
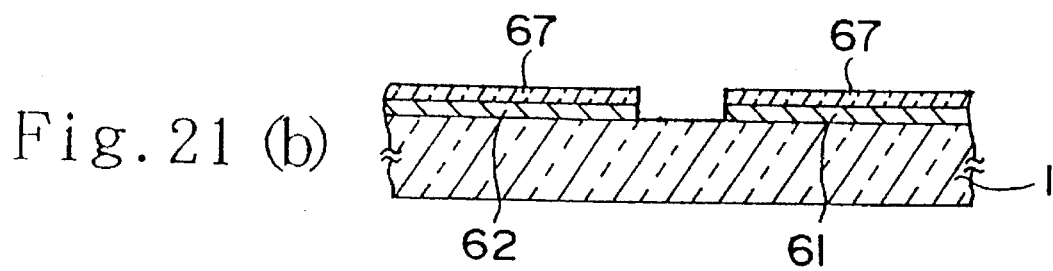
Figure 21:
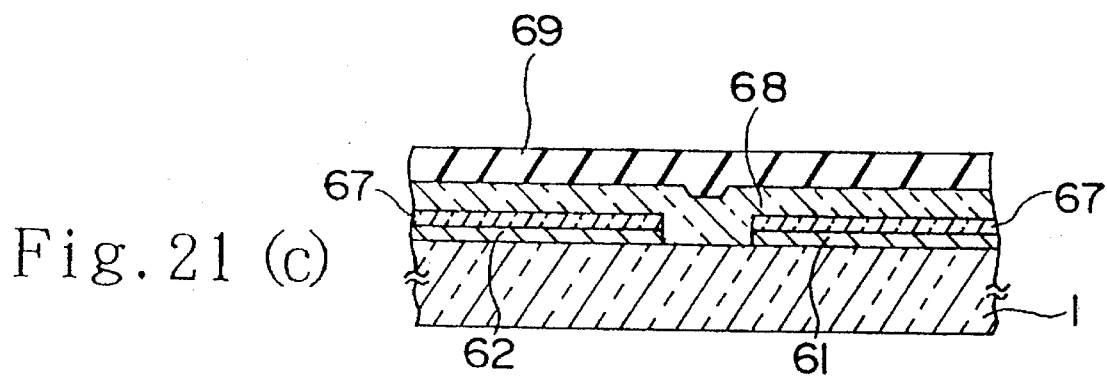
Figure 21:
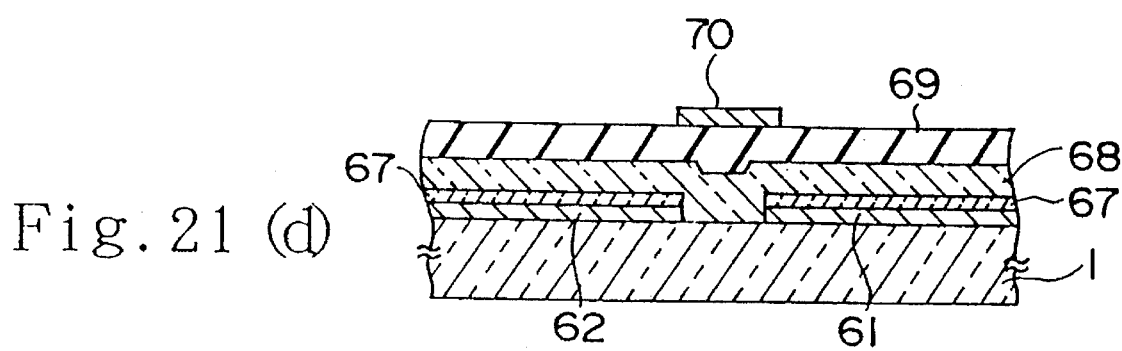

FIG. 21 shows sectional views showing a process of forming a second stagger type TFT.

First, as shown in FIG. 21(*a*), an aluminum film 60 having a film thickness of 50 nm is formed on a glass substrate 1 by the sputtering method.

Then, an impurity doped silicon film 67 is formed in a thickness of 50 nm by the plasma CVD method. The film forming conditions are such that the substrate temperature is set to 200° C., SiH$_4$ and H$_2$ are introduced at flow rates of 10 sccm and 400 sccm, respectively, the ambient pressure is set to 100 Pa, the discharge power is set to 200 W, and the discharge hour is set to 10 minutes. At the same time, PH$_3$ is introduced, and the flow rate thereof is changed from $3 \times 10^{-2}$ sccm to $1 \times 10^{-4}$ sccm from the growth start toward the growth end linearly or stepwise. With this, the impurity density is arranged to get higher as approaching to the source electrode 61 and the drain electrode 62.

After the growth of the impurity doped silicon film 67 is thus completed, patterning is applied to the impurity doped silicon film 67 and the aluminum film 60 by the photolithography method so as to form a source electrode 61 and a drain electrode 62 covering the impurity doped silicon film 67 as shown in FIG. 21(*b*).

Thereafter, a polycrystal silicon film 68 which becomes an active semiconductor film of the TFT is formed in a thickness of 100 nm by the plasma CVD method as shown in FIG. 21(*c*). The growth conditions thereof are such that the substrate temperature is set to 400° C., SiH$_4$ and H$_2$ are introduced at flow rates of 5 sccm and 500 sccm, respectively, the ambient pressure is set to 100 Pa, the discharge power is set to 300 W, and the discharge hour is set to 20 minutes.

Next, a SiO$_2$ film 69 is grown in a thickness of 100 nm by the plasma CVD method. The film forming conditions in this case are set similar to those in the 12th embodiment. Further, a molybdenum film is formed in a thickness of 50 nm on the SiO$_2$ film 69 by the sputtering method. Then, patterning is applied to the molybdenum layer by the photolithography method so as to have the molybdenum layer remain in an area between the source electrode 61 and the drain electrode 62 as shown in FIG. 21(*d*), which is used as a gate electrode 70.

With the foregoing, a stagger type TFT is completed.

According to this stagger type TFT, in the impurity containing silicon film 67, the layer making contact with the source electrode 61 and the drain electrode 62 contains impurities of the highest density, and the impurity density changes linearly or stepwise so that the density is lowered as approaching to the polycrystal silicon film 68.

Accordingly, the electric field strength in the vicinity of the drain area is reduced, thereby to suppress the OFF-state current, and in addition, the contact resistance with the source electrode 61 and the drain electrode 62 is reduced. Further, such distribution of the impurity density can be controlled with high precision and easily since only the gas flow rate is regulated.

(14) Other embodiments

In the above description on the methods for manufacturing a TFT, the impurity is phosphorus by using PH$_3$ when it is contained in crystal silicon or polycrystal silicon, which, however, is not limited thereto, but arsenic may be contained by using AsH$_3$, or boron may be contained by using gas for obtaining a P type such as B$_2$H$_6$ and BF$_3$, and it is a matter of selection which element of either the group III or the group V is to be contained.

What is claimed is:

1. A method for forming a film comprising the steps of:
   a) depositing a film formed of a binary system material on a base substance by an atomic layer deposition method in which the base substance on which the film is formed is exposed separately to two or more ambiences, one of which contains a first atom of the binary system material and the other of which contains a second atom of the binary system material; and
   b) growing poly-crystalline silicon on the film formed of the binary system material, the binary system material film is Al$_2$O$_3$, and crystal orientation of the top face of the film orients to a face (012), and crystal orientation of the top face of the poly-crystalline silicon orients to a face (100).

2. A method for forming a film according to claim 1, further comprising the step of:
   c) moving the base substance between said step a) of depositing the film formed of the binary system material and said step b) of growing poly-crystalline silicon, said steps a)-c) being performed in atmosphere having a pressure less than one atmospheric pressure.

3. A method for forming a film according to claim 1, wherein in said step a) the film formed of the binary system material is a film composed of a group III and a group V element.

4. A method for forming a film according to claim 1, wherein the binary system material film is any one of a GaP film, an AlP film and a ZnS film.

5. A method for forming a film according to claim 1, wherein in said step a) the film formed of the binary system material is formed at a substrate temperature less than or equal to 400° C.

6. A method for forming a film according to claim 1, wherein one of the ambiences is kept at a temperature which is different from a temperature of other ambiences.

7. A method for forming a film according to claim 1, wherein in said step a) the film formed of the binary system material is an Al$_2$O$_3$ film formed by exposing the base substance to gas containing oxygen and gas containing aluminum alternately.

8. A method for forming a film according to claim 7, wherein the Al$_2$O$_3$ film is exposed to Al containing gas to grow an Al layer on its top surface, and then the base substance is conveyed to an area where the poly-crystalline silicon grows while exposing the Al layer to another Al containing gas having a temperature which is kept below a temperature at which aluminum does not grow.

9. A method for forming a film according to claim 8, wherein the gas containing aluminum is Al(CH$_3$)$_3$.

10. A method for forming a film according to claim 1, wherein in said step b) the poly-crystalline silicon film is formed in an ambience at a temperature of 250° C. to 400° C.

11. A method for forming a film according to claim 1, wherein in said step b) the growth of the poly-crystalline silicon film is by a plasma chemical vapor deposition method using reaction gas containing hydrogen and silane.

12. A method for forming a film according to claim 1, further comprising the substep of:

growing a silicon containing insulating film which becomes the foundation of the film formed of the binary system material on the base substance before said step a) of depositing the film formed of the binary system material on the base substance.

13. A method for forming a film according to claim 12, wherein the silicon containing insulating film is one of a SiN film, a SiON film and a $SiO_2$ film.

14. A method for manufacturing a thin film transistor comprising the steps of:

a) depositing a film formed of a binary system material by an atomic layer deposition method in which an object substance on which a film is formed is exposed sequentially to two or more ambiences containing two atoms individually forming a binary system material;

b) growing a poly-crystalline silicon film on the film formed of the binary system material, the binary system material film is $Al_2O_3$, crystal orientation of the top face of the film orient to a face (012) and crystal orientation of the top face of the polycrystalline silicon orient to a face (100);

c) forming a gate insulator on the polycrystalline silicon film;

d) forming a gate electrode on the gate insulator; and e) forming a source layer in the poly-crystalline silicon film on one side of the gate electrode and forming a drain layer in the poly-crystalline silicon film on the other side thereof.

15. A method for manufacturing a thin film transistor according to claim 14, wherein the binary system material film formed in said step a) is any one of a GaP film, an AlP film and a ZnS film.

16. A method for manufacturing a thin film transistor according to claim 14, wherein the binary system material film formed in said step a) is formed at a substrate temperature less than or equal to 400° C.

17. A method for manufacturing a thin film transistor according to claim 14, further comprising, before said step a), the step of growing a silicon containing insulating film which becomes the foundation of the film formed of the binary system material.

18. A method for manufacturing a thin film transistor according to claim 17, wherein the silicon containing insulating film is one of a SiN film, a SiON film and a $SiO_2$ film.

19. A method for manufacturing a thin film transistor according to claim 14, wherein the poly-crystalline silicon film formed in said step b) is grown at a temperature between 250° C. and 400° C.

20. A method for manufacturing a thin film transistor comprising the steps of:

a) forming a gate electrode;

b) depositing a film formed of a binary system material on the gate electrode by an atomic layer deposition method in which a base substance on which a film is formed is exposed consecutively to each of two or more ambiences containing two atoms individually forming the binary system material;

c) growing a poly-crystalline silicon film on the film formed of the binary system material, the binary system material is $Al_2O_3$, and crystal orientation of the top face of the film orients to a face (012) and crystal orientation of the top face of the poly-crystalline silicon orients to a face (100);

d) forming a contact film composed of an impurity containing silicon on the crystal silicon film; and e) forming a source electrode and a drain electrode isolated from each other in the upper part of the gate electrode.

21. A method for manufacturing a thin film transistor according to claim 20, wherein in said step b) the film formed of a binary system material is formed in an ambience at a temperature less than or equal to 400° C.

22. A method for manufacturing a thin film transistor according to claim 20, comprising, before said step a), a step of growing a silicon containing insulating film covering the gate electrode and becoming the foundation of the film formed of a binary system material.

23. A method for manufacturing a thin film transistor according to claim 22, wherein the silicon containing film is one of a SiN film, a SiON film and a $SiO_2$ film.

24. A method for manufacturing a thin film transistor according to claim 20, wherein, in said step c), the poly-crystalline silicon film grows at a temperature of 250° C. to 400° C.

* * * * *

UNITED STATES PATENT AND TRADEMARK OFFICE
CERTIFICATE OF CORRECTION

PATENT NO. : 5,480,818

DATED : January 2, 1996

INVENTOR(S) : Tomotaka MATSUMOTO et al.

It is certified that error appears in the above-indentified patent and that said Letters Patent is hereby corrected as shown below:

Throughout entire patent all instances of "Al" should be –A$\ell$–.

Column 2, line 2, delete "therefrom thus," and insert –therefrom. Thus,–

Column 3, line 18, delete "off" and insert –of–.

Column 5, line 15, delete "sshown" and insert –shown–.

Column 6, line 37, delete "BesIdes" and insert –Besides,–.

Column 7, line 15, delete "n" and insert –thin–;

line 19, delete "i" and insert –1–; and line 27, delete "off" and insert –of–.

Column 8, line 58, after "Al(CH$_3$)$_3$" insert a space.

Column 11, line 48, after "is" insert –formed–.

Column 12, line 59, delete "end" and insert –and–.

Column 13, line 59, delete "ther-" and insert –there–; and line 60, delete "ebetween," and insert –between,–.

UNITED STATES PATENT AND TRADEMARK OFFICE
CERTIFICATE OF CORRECTION

PATENT NO. : 5,480,818
DATED : January 2, 1996
INVENTOR(S) : Tomotaka MATSUMOTO et al.

It is certified that error appears in the above-indentified patent and that said Letters Patent is hereby corrected as shown below:

Column 15, line 38, delete "i" and insert --1--.

Column 16, line 23, "1s" should be --is--.

Column 17, line 12, delete "AS" and insert --A$\ell$--; and line 50, delete "In" and insert --in--.

Column 23, line 25, delete "polycrystalline" and insert

--poly-crystalline--.

Signed and Sealed this

Sixteenth Day of April, 1996

Attest:

BRUCE LEHMAN

*Attesting Officer*  *Commissioner of Patents and Trademarks*